US010685944B2

(12) United States Patent
Wang

(10) Patent No.: US 10,685,944 B2
(45) Date of Patent: Jun. 16, 2020

(54) FILM SENSORS ARRAY AND METHOD

(71) Applicant: James Jen-Ho Wang, Phoenix, AZ (US)

(72) Inventor: James Jen-Ho Wang, Phoenix, AZ (US)

(*) Notice: Subject to any disclaimer, the term of this patent is extended or adjusted under 35 U.S.C. 154(b) by 98 days.

(21) Appl. No.: 15/790,057

(22) Filed: Oct. 23, 2017

(65) Prior Publication Data

US 2018/0114784 A1   Apr. 26, 2018

Related U.S. Application Data

(60) Provisional application No. 62/412,480, filed on Oct. 25, 2016.

(51) Int. Cl.

| | |
|---|---|
| H01L 25/16 | (2006.01) |
| G01K 7/01 | (2006.01) |
| H01L 23/46 | (2006.01) |
| H01L 23/32 | (2006.01) |
| H01L 25/00 | (2006.01) |
| G01K 7/22 | (2006.01) |
| H01L 23/13 | (2006.01) |
| H01L 23/00 | (2006.01) |
| H01L 23/14 | (2006.01) |

(52) U.S. Cl.
CPC ............ *H01L 25/16* (2013.01); *G01K 7/01* (2013.01); *G01K 7/22* (2013.01); *H01L 23/13* (2013.01); *H01L 23/145* (2013.01); *H01L 23/32* (2013.01); *H01L 23/46* (2013.01); *H01L 24/00* (2013.01); *H01L 25/50* (2013.01); *H01L 2224/48091* (2013.01); *H01L 2224/48227* (2013.01); *H01L 2224/48465* (2013.01); *H01L 2224/73265* (2013.01)

(58) Field of Classification Search
CPC ............... H01L 25/16; G01L 19/0092; G01L 2019/0053; G06F 2203/04105; G01F 1/844; G01N 2015/0073; G01N 27/44791; G01N 33/555; G01R 33/302; G05D 7/0694
See application file for complete search history.

(56) References Cited

U.S. PATENT DOCUMENTS

| | | | | |
|---|---|---|---|---|
| 8,998,454 B2* | 4/2015 | Wang | ................ | F21V 19/003 362/249.02 |
| 9,282,596 B2* | 3/2016 | Wang | ................ | H05B 45/20 |
| 9,668,352 B2* | 5/2017 | Wang | ................ | H05K 1/183 |
| 2008/0230892 A1* | 9/2008 | Chang | ................ | H01L 25/0657 257/700 |

(Continued)

OTHER PUBLICATIONS

Petropoulos et al., A flexible capacitive device for pressure and tactile sensing, Procedia Chemistry, 1, 2009, pp. 867-870 (Year: 2009).*

*Primary Examiner* — Earl N Taylor
(74) *Attorney, Agent, or Firm* — Edward James Mischen

(57) ABSTRACT

In accordance with an embodiment, sensor structure has a first, second, and third laminated structures. The second laminated structure is positioned between the first laminated structure and the third laminated structure. The first laminated structure includes a first portion of a first sensing element and the third laminated structure includes a second portion of the first sensing element. The second laminated structure includes spacer elements that can be used to adjust the sensitivity of the sensor structure.

24 Claims, 27 Drawing Sheets

(56) References Cited

U.S. PATENT DOCUMENTS

| | | | | |
|---|---|---|---|---|
| 2010/0206619 A1* | 8/2010 | Chen | H01L 23/13 | 174/252 |
| 2010/0301452 A1* | 12/2010 | Wang | H01L 23/5223 | 257/532 |
| 2012/0061796 A1* | 3/2012 | Wang | H01L 23/522 | 257/530 |
| 2012/0320532 A1* | 12/2012 | Wang | H05K 1/165 | 361/720 |
| 2014/0090488 A1* | 4/2014 | Taylor | G01L 1/18 | 73/862.625 |
| 2014/0167618 A1* | 6/2014 | Wang | H05B 45/37 | 315/152 |
| 2014/0268594 A1* | 9/2014 | Wang | H05K 1/183 | 361/749 |
| 2014/0268780 A1* | 9/2014 | Wang | F21V 19/003 | 362/249.06 |
| 2016/0033347 A1* | 2/2016 | Hayashi | G01L 9/0042 | 73/723 |
| 2016/0047704 A1* | 2/2016 | Hayashi | G01L 9/0042 | 73/727 |
| 2016/0060098 A1* | 3/2016 | Ikehashi | B81B 3/0021 | 257/415 |
| 2016/0365198 A1* | 12/2016 | Pan | G01L 1/02 | |
| 2018/0114784 A1* | 4/2018 | Wang | H01L 25/16 | |

\* cited by examiner

FILM SENSORS ARRAY AND METHOD

The present application is a nonprovisional application of the provisional application having U.S. patent application Ser. No. 62/412,480 filed on Oct. 25, 2016, by James Jen-Ho Wang, titled "Film Sensors and Methods Thereof" which is hereby incorporated by reference in its entirety, and priority thereto for common subject matter is hereby claimed.

FIELD OF THE INVENTION

The present invention relates, in general, to electronics and, more particularly, to electronics in combination with fluids.

BACKGROUND

In the past, sensors have been used in a variety of applications including, but not limited to, sensing moisture, humidity, sound, temperature, light, gases, chemicals, magnetic fields, electrical currents, voltages, fluid flow, liquid volume, concentrations of solutes in liquids, tire pressure, biological materials in a liquid sample, and physical stresses. Most sensors are discrete elements designed to sense a particular parameter. A discrete sensor is mounted to a rigid structure such as a printed circuit. Depending on the application, other devices such as, for example, discrete switches, control devices, and heat removal structures, may be mounted on the rigid structure along with the discrete sensor. The heat removal structures may be cooling fins that are coupled to the power devices, wherein the heat removal structures are mounted to a separate structure from the structure on which the power device is mounted. Because of the number of discrete components used to make up an electronic system is large, these systems tend to be bulky, heavy, and expensive to manufacture.

By way of example, a pressure sensor is typically a discrete sensor that is mounted to a printed circuit board. The pressure sensor may be made up of a thin layer of stainless steel that has two strain gauges attached along two of its axes. Pressure is indirectly measured by deforming the thin stainless steel layer where the bending changes the ohmic resistance of the attached strain gauges by less than 0.1 percent. The change in ohmic resistance is determined using a Wheatstone bridge. The accuracy of the measurement depends on the thickness of the stainless steel layer, the accuracy of the resistors of the Wheatstone bridge, temperature coefficients of the components making up the pressure sensor, etc. If the sensor is configured as an array of sensors, the accuracy of the measurement is also dependent on the distance between the sensors. Drawbacks with pressure sensors mounted to printed circuit boards include their size and the weight of the strain gauges.

Thus, a sensor structure capable of sensing more than a single parameter includes a plurality of sensors. For example, to measure temperature, humidity, and pressure, three discrete sensors are mounted to a rigid structure such as a printed circuit board and electrically connected to sensory electronics that are also mounted to the printed circuit board.

Another class of discrete sensors are bio-sensors. These types of sensors may be used to monitor a component of blood, such as blood glucose. A drawback with these types of sensors is that the analytes, reactants, and by-products in the sensors must be purged and removed before the sensors can be re-used.

Accordingly, it would be advantageous to have sensors or sensor structures capable of providing continuous monitoring, that can monitor one or more parameters, that are light weight, and portable, and that can be purged and reused. It would be of further advantage for the semiconductor components, sensing elements, electronics, sensors, power devices, etc. and the methods of sensing and manufacturing of the sensors to be cost and time efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
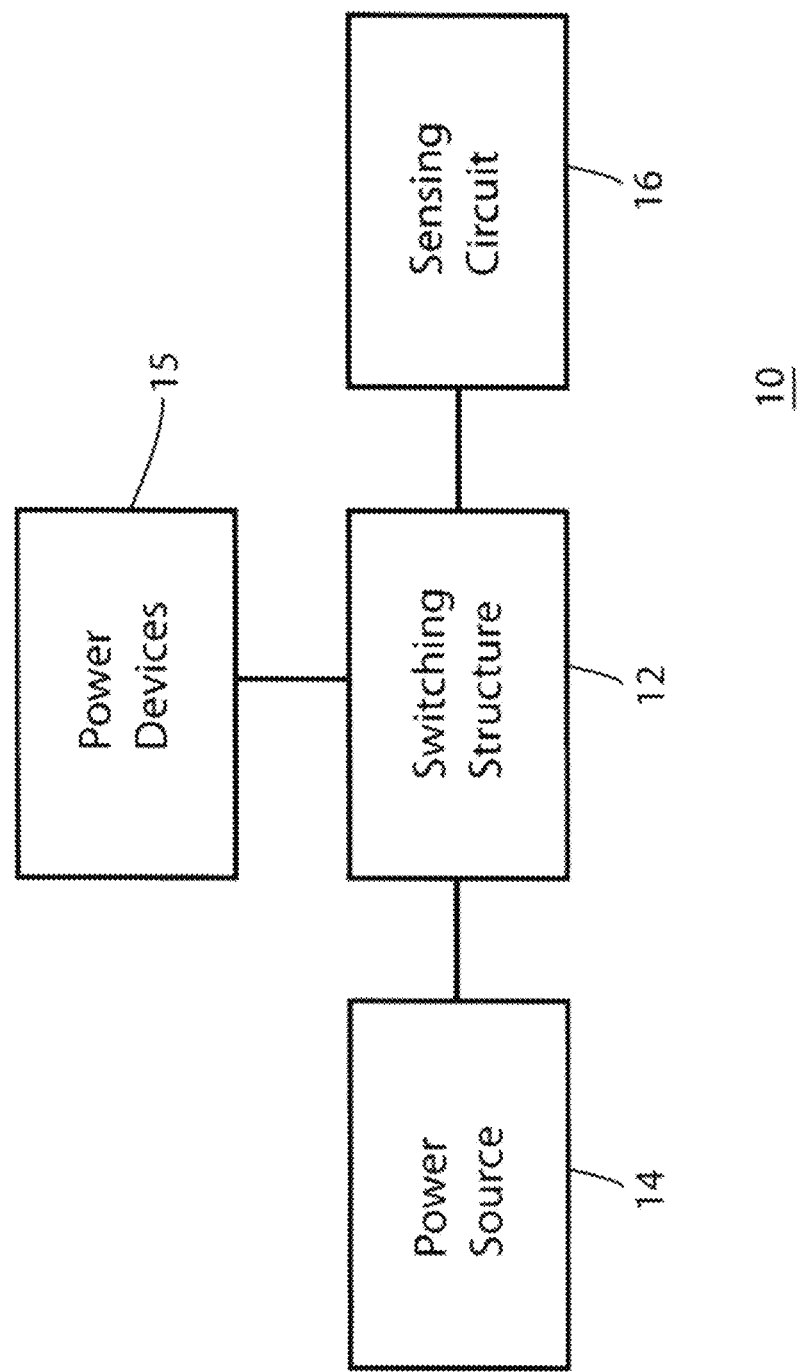
FIG. 1 is a block diagram of a sensing structure in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten per cent (10%) (and up to twenty per cent (20%) for semiconductor doping concentrations) are regarded as reasonable variances from the ideal goal of being exactly as described.

DETAILED DESCRIPTION

FIG. 1 is a block diagram of sensing unit 10 in accordance with an embodiment of the present invention. Sensing unit 10 includes a switching structure 12 connected to a power source 14, one or more power devices 15, and to sensing circuitry 16. Switching structure 12 is configured to open and close in response to a physical stress such as, for example, being pressed by a finger, a shipping box, a dog's nose, electronically controlled switches, etc. In response to an external stimulus such as, for example, being pressed, switching structure 12 closes connecting power source 14 to sensing circuitry 16, which generates an output signal indicating, for example, the location being pressed, the force pressing against the sensor, or both. Although switching structure 12 is described as including a pressure sensor, this is not a limitation of the present invention.

It should be noted that in accordance with embodiments in which sensing structures are formed from film electronics, at least switching structure 12 and sensing circuits 16 can be manufactured from a single film. Switching structure 12 can be configured to switch one or more sensors and/or one or more power devices simultaneously. In accordance with another embodiment, multiple sensors can be combined with multiple drive circuits to open a door, shift weight in a bed to lessen the probability of bed sores being formed, to move an arm, etc.

In accordance with another embodiment, sensors, switching circuits, switching structures, drive circuits, power devices, and heat dissipation devices can be configured on a film to conduct heat from the circuitry and through the films making up the thin films on which the sensors, switching circuit, drive devices, and/or power electronics are mounted. In addition, film electronics can be configured to rapidly remove heat or spread heat using fluids including a gas, water, other fluids, etc. Gases, fluids, electromagnetic fields, electromagnetic energy, sounds, vibrations, and chemicals can pass next to, into or through film electronics where sensing circuits, power devices and switching structures are embedded. Proximity of film sensors to analytes is achieved while separating sensitive film electronics from damaging effects of analytes, chemicals, fluids, temperatures, and noises.

Figure 2:
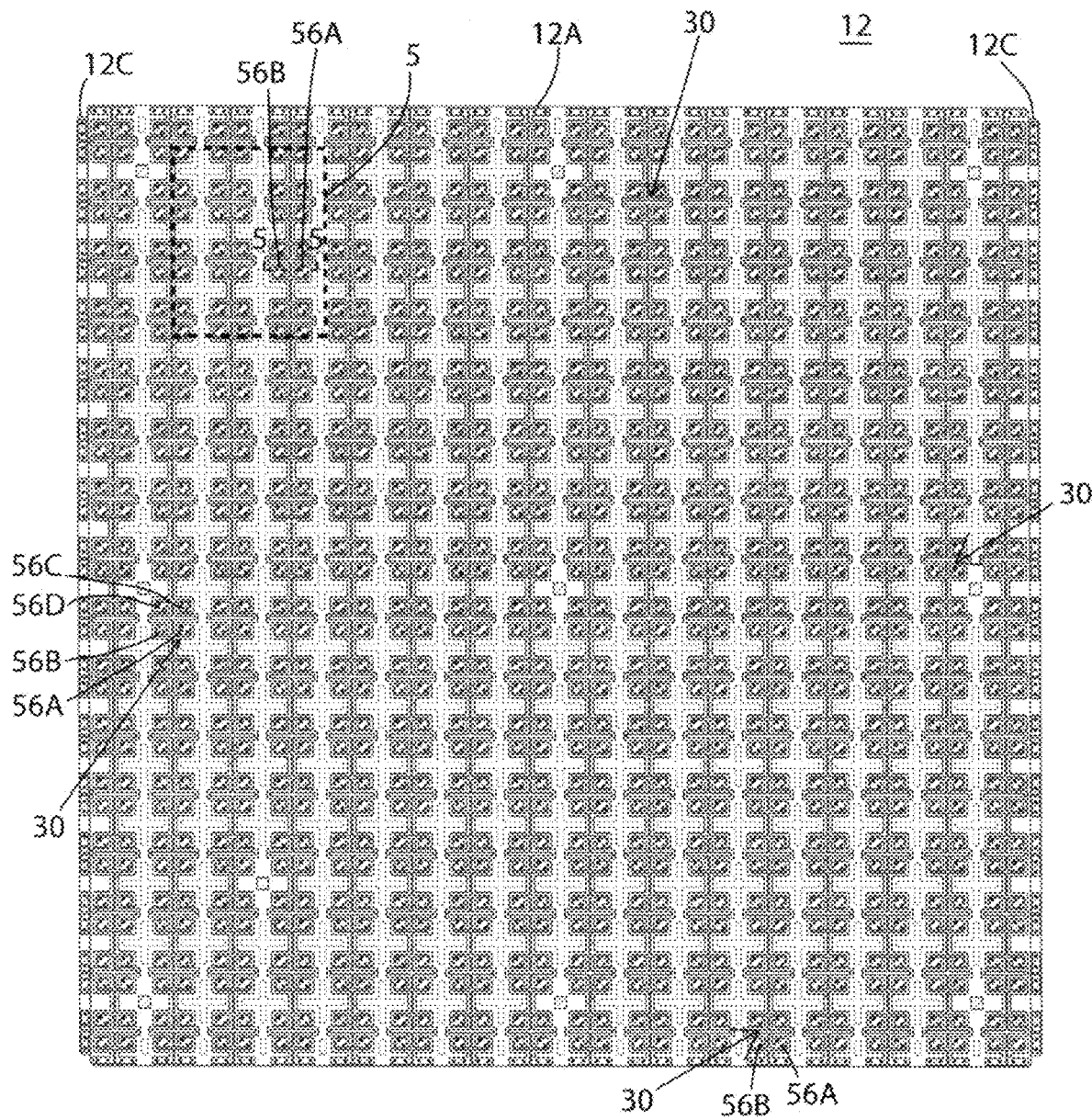
FIG. 2 is a top view of a portion of the sensing structure in accordance with an embodiment of the present invention.

FIG. 2 is a top view of a film sensor array 12 in accordance with an embodiment of the present invention. Film sensor array 12 may be referred to as a sensing unit, sensor unit, sensor architecture, switches, or the like. More particularly, FIG. 2 illustrates an array of 256 sensing elements. By way of example, the size of the array shown in FIG. 2 is 4 inches by 4 inches. Film sensor array 12 may be comprised of a plurality of film layers or laminated film structures in a stacked configuration. By way of example, film sensor array 12 may include three stacked laminated film structures, where a laminated film structure 12B (shown in FIG. 6) is between or separates laminated film structures 12A and 12C. Laminated film structure 12A and a portion of laminated film structure 12C are shown in FIG. 2. For the sake of completeness, FIG. 3 is included to show a top view of laminated film structure 12A.

Figure 3:
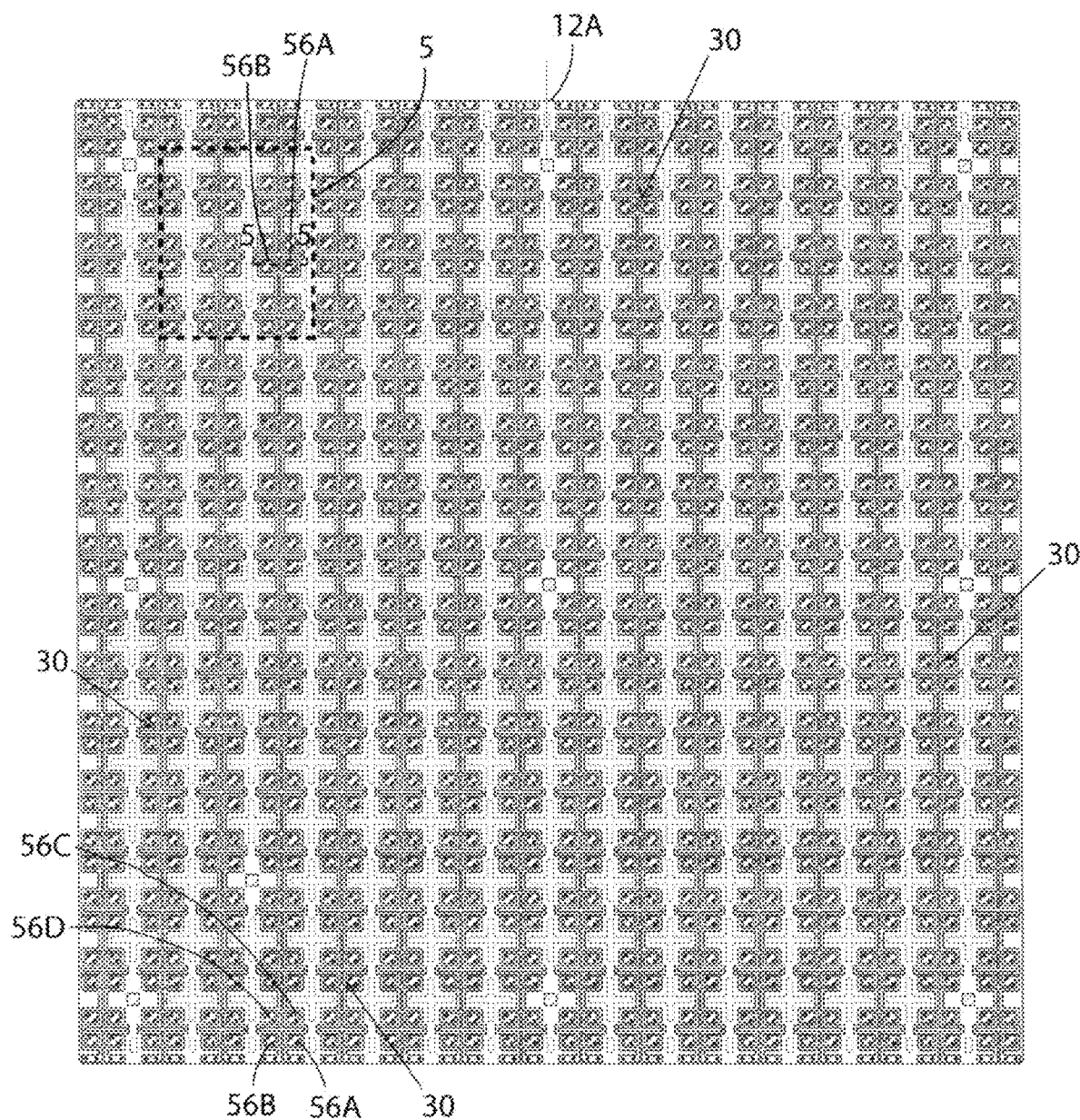
FIG. 3 is a top view of a portion of the sensing structure of FIG. 2 in accordance with an embodiment of the present invention.

FIGS. 2 and 3 further illustrate electrically conductive structures 56A, 56B, 56C, and 56D within switching elements 30. Switching elements 30 and electrically conductive structures are further described with reference to FIG. 5. In accordance with embodiments in which switching elements 30 are configured as pressure sensors, different portions of a switching element may respond to a different pressure created by for example, a finger pressing on switching element 30. For example, a portion of switching element 30 having electrically conductive structure 56A may respond to a higher pressure than a portion of switching element 30 having electrically conductive structure 56B, which may respond to a higher pressure than a portion of switching element 30 having electrically conductive structure 56C, which may respond to a higher pressure than a portion of switching element 30 having electrically conductive structure 56D. Thus, the different portions of switching elements 30 may be configured to have a different sensitivity to pressure.

Figure 4:
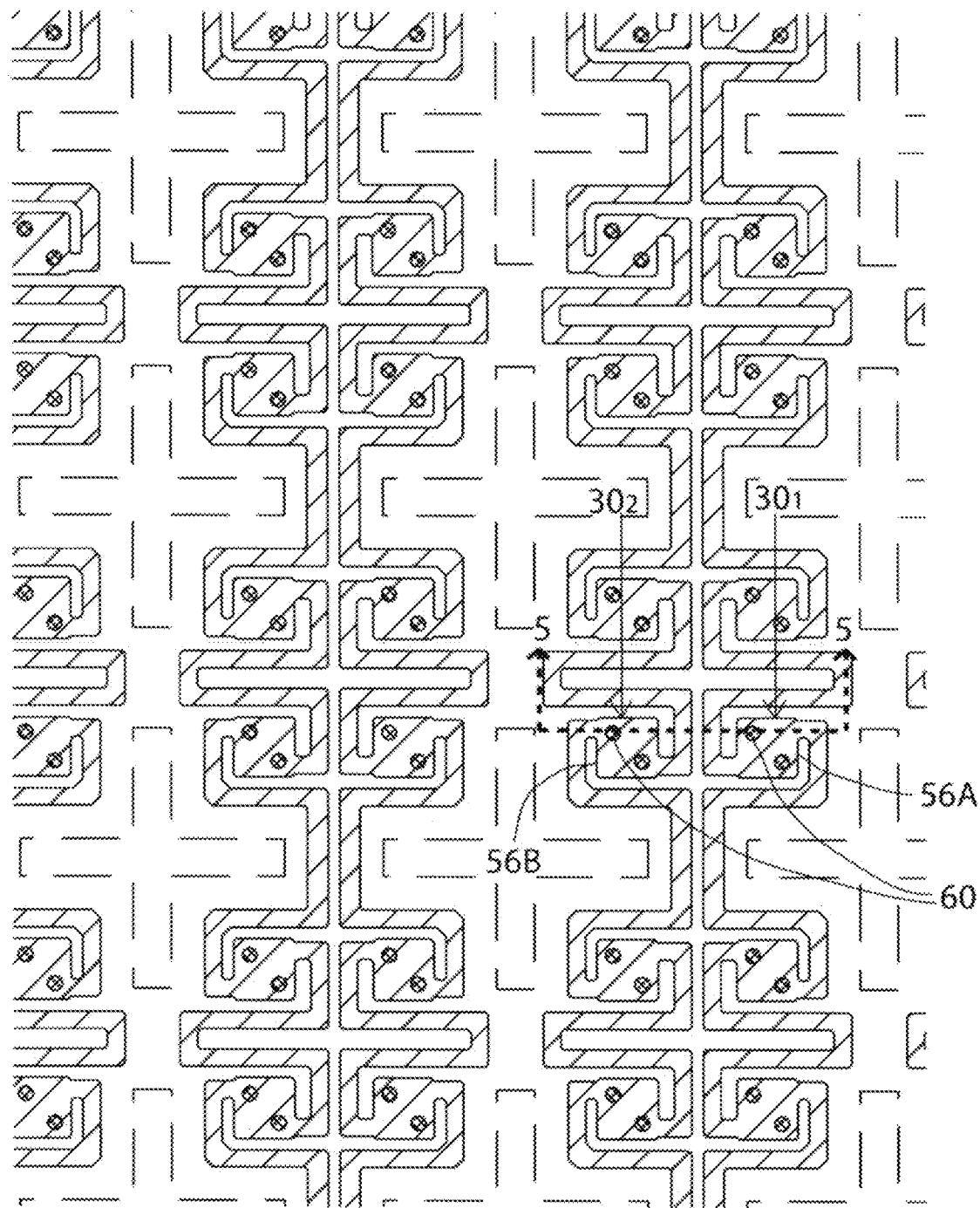
FIG. 4 is an exploded top view of the portion of the switching structure of FIGS. 2 and 3 bounded by the broken line box of FIGS. 2 and 3.

FIG. 4 is an exploded top view of the portion of the laminated film structure 12A of FIGS. 2 and 3 bounded by broken line 5 in FIGS. 2 and 3. FIG. 4 further illustrates electrically conductive portion 56A of switching element $30_1$, electrically conductive portion 56B of switching element $30_2$, and vias 60.

Figure 5:
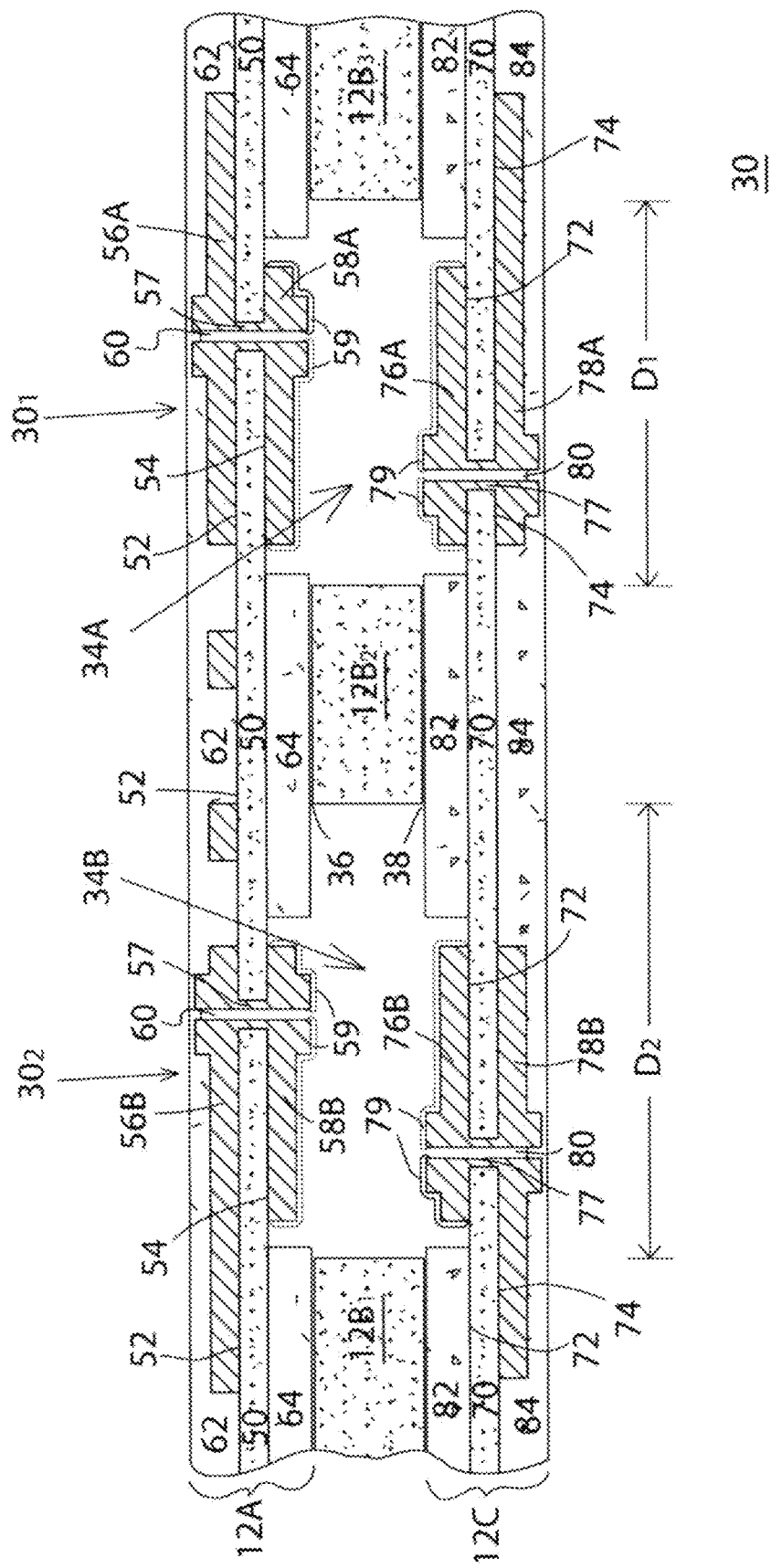
FIG. 5 is a cross-sectional view of a portion of a switching structure of FIG. 4 taken along section line 5-5 of FIGS. 2, 3, and 4.

FIG. 5 is a cross-sectional view of a portion of film sensor array 12 taken along section line 5-5 of FIGS. 2 and 3. What is shown in FIG. 5 are switching elements 30 in accordance with an embodiment of the present invention. For the sake of clarity portions of two switching elements of the plurality of switching elements 30 are illustrated in FIG. 5 and are identified by reference characters $30_1$ and $30_2$. It should be noted that in the embodiment shown in FIGS. 2-5, switching elements 30, e.g., switching elements $30_1$ and $30_2$, are fabricated as a bendable or foldable structure comprising three structures 12A, 12B, and 12C. More particularly, switching elements 30 may be comprised of a structure 12B which is located or positioned between structures 12A and 12C. Structure 12B has openings 34A and 34B, surfaces 36, and surfaces 38. By way of example, structure 12B is polyimide having a thickness ranging from about 0.25 mils to about 10 mils, structure 12A is a laminated film structure having a thickness ranging from about 0.5 mils to about 6 mils, and structure 12C is a laminated film structure having a thickness ranging from about 0.5 mils to about 6 mils. Other suitable materials for structure 12B include liquid crystal polymer, a film adhesive, silicone, paper, polyethylene, polystyrene, aluminum foil, magnetic steel foil, stainless steel foils, thermal interface film, polytetrafluoroethylene, which may be sold under the tradename Teflon, and the like. Alternatively, structure 12B can be a laminated structure. The thicknesses of structures 12A, 12B, and 12C are not limitations of the present invention. By way of example, laminated film structures 12A and 12C may be formed from an insulated metal substrate such as, for example, a double bonded copper substrate. As those skilled in the art are aware a mil is approximately 25.4 micrometers.

In accordance with an embodiment, laminated film structure 12A may be a metal-insulator-metal substrate, comprising a film 50 having surfaces 52 and 54 and an electrically conductive material formed on surface 52 and an electrically conductive material formed on surface 54. Suitable materials for film 50 include liquid crystal polymer, a film adhesive, silicone, paper, polyethylene, polystyrene, aluminum foil, magnetic steel foil, stainless steel foils, thermal interface film, polytetrafluoroethylene, which may be sold under the tradename Teflon, and the like. By way of example, electrically conductive structures 56 and 58 are made from one ounce copper. The thicknesses of structure 12B and film 50 are not limitations of the present invention.

Vias 60 are formed in portions of laminated film substrate 12A, wherein vias 60 extend through laminated film structure 12A. A plated electrically conductive material 57 electrically connects electrically conductive structure 56B to electrically conductive structure 58B and electrically conductive structure 56A to electrically conductive structure 56B. After formation of vias 60, portions of the electrically conductive material on surface 52 of film 50 are removed to form electrically conductive structures 56A and 56B on surface 52 and portions of the electrically conductive material on surface 54 are removed to form electrically conductive structures 58A and 58B. Layers of an electrically conductive material 59 are formed on electrically conductive structures 58A and 58B. Electrically conductive layers 59 may be formed by electroplating. By way of example, electrically conductive layer 59 is a metallization system comprising nickel, palladium, and gold, where the nickel is electroplated on the electrically conductive material of electrically conductive structures 58A and 58B, palladium is electroplated on the nickel, and gold is electroplated on the palladium.

A film 62 is disposed on surface 52 and electrically conductive structures 56A and 56B and a film 64 is formed on portions of surface 54. Film 64 is laterally spaced apart from electrically conductive portions 58A and 58B. Portions of film 64 are bonded to laminated film structure 12A. Suitable materials for layers 62 and 64 include liquid crystal polymer, film adhesive, silicone, paper, polyethylene, polystyrene, photo-imageable polyimide, aluminum foil, magnetic steel foil, stainless steel foils, thermal interface film, polytetrafluoroethylene, which may be sold under the tradename Teflon, and the like. The thicknesses of material layer 34, film 50, film 70 are not limitations of the present invention.

In accordance with an embodiment, laminated film structure 12C is a metal-insulator-metal substrate, comprising a film 70 having surfaces 72 and 74, an electrically conductive material formed on surface 72 to form electrically conductive structures 76A and 76B, and an electrically conductive material formed on surface 74 that is patterned to form electrically conductive structures 78A and 78B. Suitable materials for film 70 include polyimide, liquid crystal polymer, a film adhesive, silicone, paper, polyethylene, polystyrene, a thermal interface film, polytetrafluoroethylene, which may be sold under the tradename Teflon, and the like. By way of example, electrically conductive structures 76A, 76B, 78A and 78B are made from one ounce copper. The thicknesses of film 50 and film 70, and the electrically conductive materials from which electrically conductive structures 76A, 76B, 78A, and 78B are manufactured are not limitations of the present invention.

Vias 80 are formed in portions of laminated film substrate 12C, wherein vias 80 extend through laminated film structure 12C. After formation of vias 80, portions of the electrically conductive material on surface 72 of film 70 are removed to form electrically conductive structures 76A and 76B on surface 72 and portions of the electrically conductive material on surface 74 are removed to form electrically conductive structures 78A and 78B. Layers of an electrically conductive material 79 are formed on electrically conductive structures 78A and 78B. Electrically conductive layers 79 may be formed by electroplating. By way of example, electrically conductive layer 79 is a metallization system comprising nickel, palladium, and gold, where the nickel is electroplated on the electrically conductive material of electrically conductive structures 76A and 76B, palladium is electroplated on the nickel, and gold is electroplated on the palladium.

A film 82 is disposed on surface 72 and electrically conductive portions 76A and 76B and a film 84 is formed on portions of surface 74. Film 82 is laterally spaced apart from electrically conductive structures 76A and 76B. Portions of film 84 are bonded to laminated film structure 12C. Suitable materials for layers 82 and 84 include polyimide, liquid crystal polymer, a film adhesive, silicone, paper, polyethylene, polystyrene, photo-imageable polyimide, a thermal interface film, polytetrafluoroethylene, which may be sold under the tradename Teflon, and the like. The thicknesses of laminated film structure 12C, film 82, and film 84 are not limitations of the present invention.

It should be noted that electrically conductive structure 56A is electrically connected to electrically conductive structure 58A by plated electrically conductive material 57, electrically conductive structure 56B is electrically connected to electrically conductive structure 58B by plated electrically conductive material 57, electrically conductive structure 76A is electrically connected to electrically conductive structure 78B by plated electrically conductive material 77, and electrically conductive structure 76A is electrically connected to electrically conductive structure 78A by plated electrically conductive material 77. By way of example, electrically conductive portions 57 and 77 are metallization systems comprising nickel, palladium, and gold, where the nickel is electroplated on the exposed portions of electrically conductive structures 56A, 56B, 58A, 58B, 76A, 76B, 78A, and 78B, palladium is electroplated on the nickel, and gold is electroplated on the palladium.

Laminated film structure 12A is positioned above surface 36 of structure 12B and laminated film structure 12C is positioned below surface 38 of structure 12B. Alternatively, an adhesive material can be used to bond surfaces 35 and 38 to structure 12B.

Figure 6:
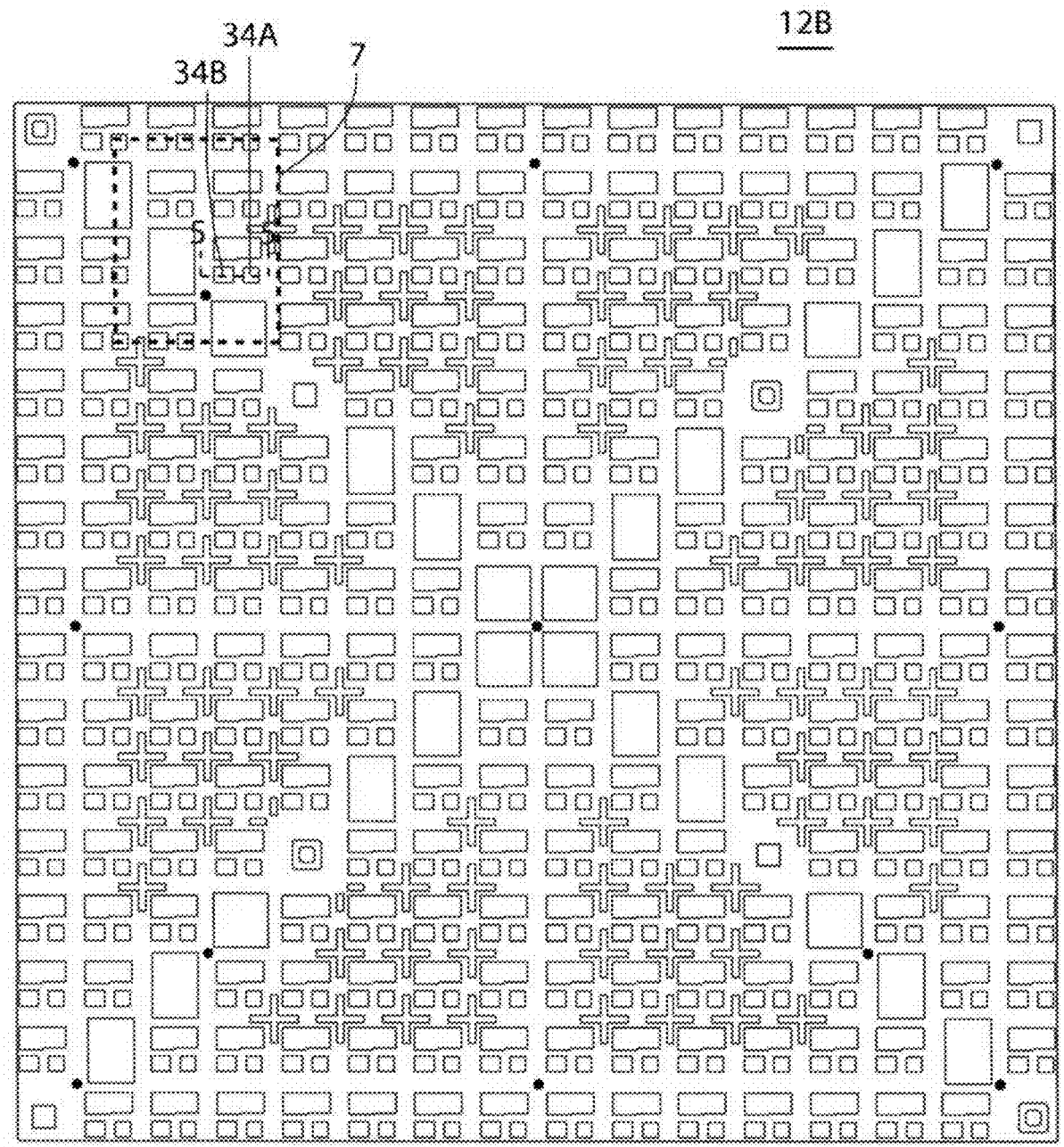
FIG. 6 is a top view of a portion of the switching structure of FIG. 2 in accordance with an embodiment of the present invention.

FIG. 6 is a top view of a portion of structure 12B of FIG. 5 in accordance with an embodiment of the present invention. It should be appreciated that structure 12B is between structures 12A and 12C and is therefore not visible in FIG. 2. FIG. 6 further illustrates openings 34A and 34B that are shown in FIG. 5.

Figure 7:
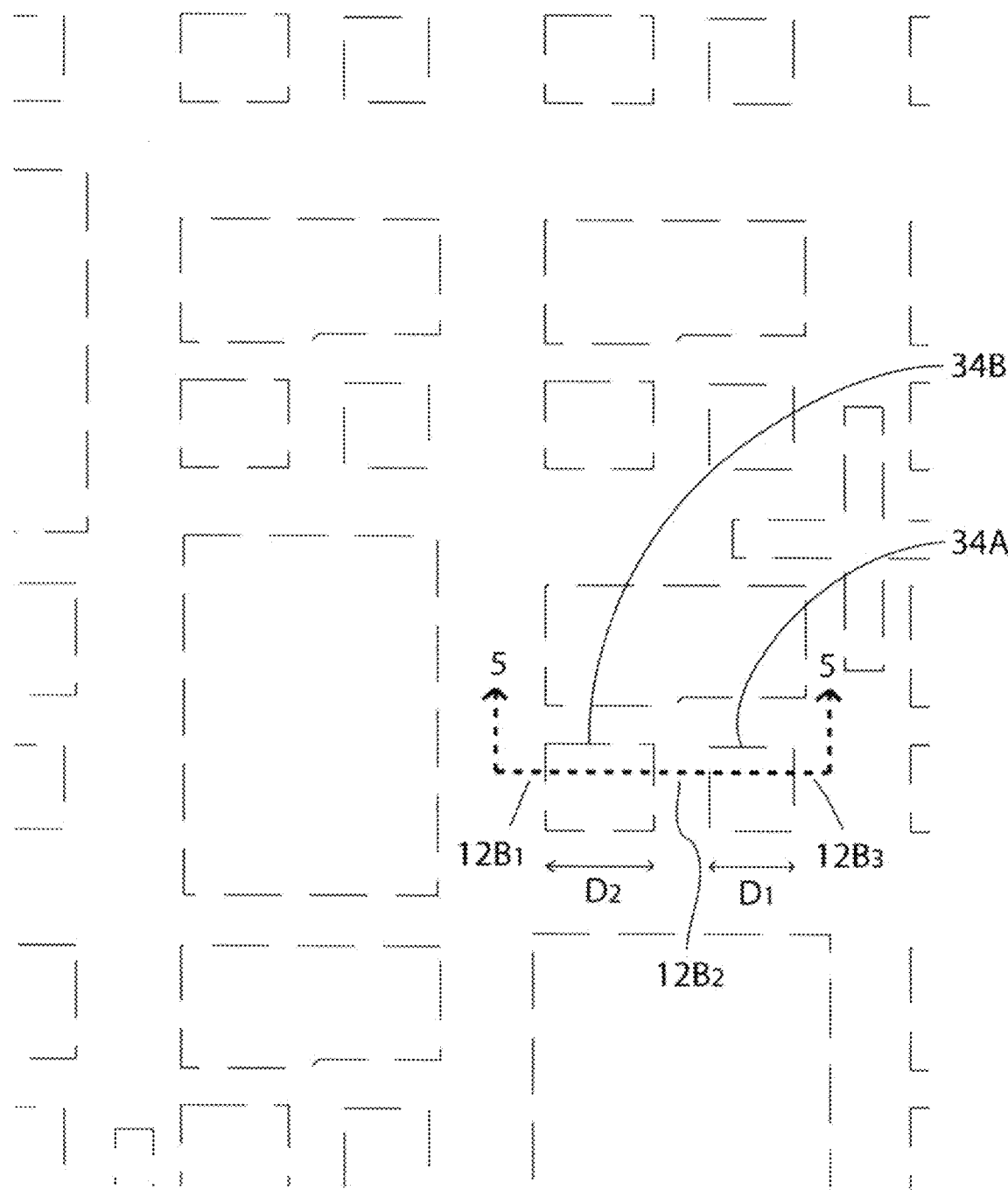
FIG. 7 is an exploded top view of the portion of the switching structure of FIGS. 2 and 3 bounded by the broken line box of FIG. 6.

FIG. 7 is an exploded top view of the portion of structure 12B bounded by broken line box 7 of FIG. 6. More particularly, FIG. 7 shows portions $12B_1$, $12B_2$, and $12B_3$ of structure 12B. Portions $12B_1$, $12B_2$, and $12B_3$ may be referred to as spacer elements. In the embodiment shown in FIG. 7, spacer element $12B_1$ is spaced apart from or separated from spacer element $12B_2$ by a distance $D_2$ and spacer element $12B_2$ is spaced apart from or separated from spacer element $12B_3$ by a distance $D_1$. It should be noted that an opening 34A is between spacer elements $12B_2$ and $12B_3$ and an opening 34B is between spacer elements $12B_1$ and $12B_2$. In accordance with the embodiment shown in FIGS. 5 and 7, distance $D_1$ is less than distance $D_2$, i.e., distance $D_2$ is greater than distance $D_1$. The pressure sensitivity of switching elements or sensing elements 30, e.g., sensing elements $30_1$ and $30_2$, can be tuned by adjusting the thickness of structure 12B, adjusting the distance between spacer elements such as spacer elements $12B_1$ and $12B_2$, and adjusting the distance between spacer elements $12B_2$ and $12B_3$. It should be appreciated that pressure sensitivity can be tuned by adjusting the thicknesses and distances either individually or adjusting a combination of one or more of the parameters. FIG. 7 further illustrates that in this embodiment distance $D_1$ of opening 34A is less than distance $D_2$ of opening 34B, where openings 34A and 34B have been described with reference to FIG. 5.

Figure 8:
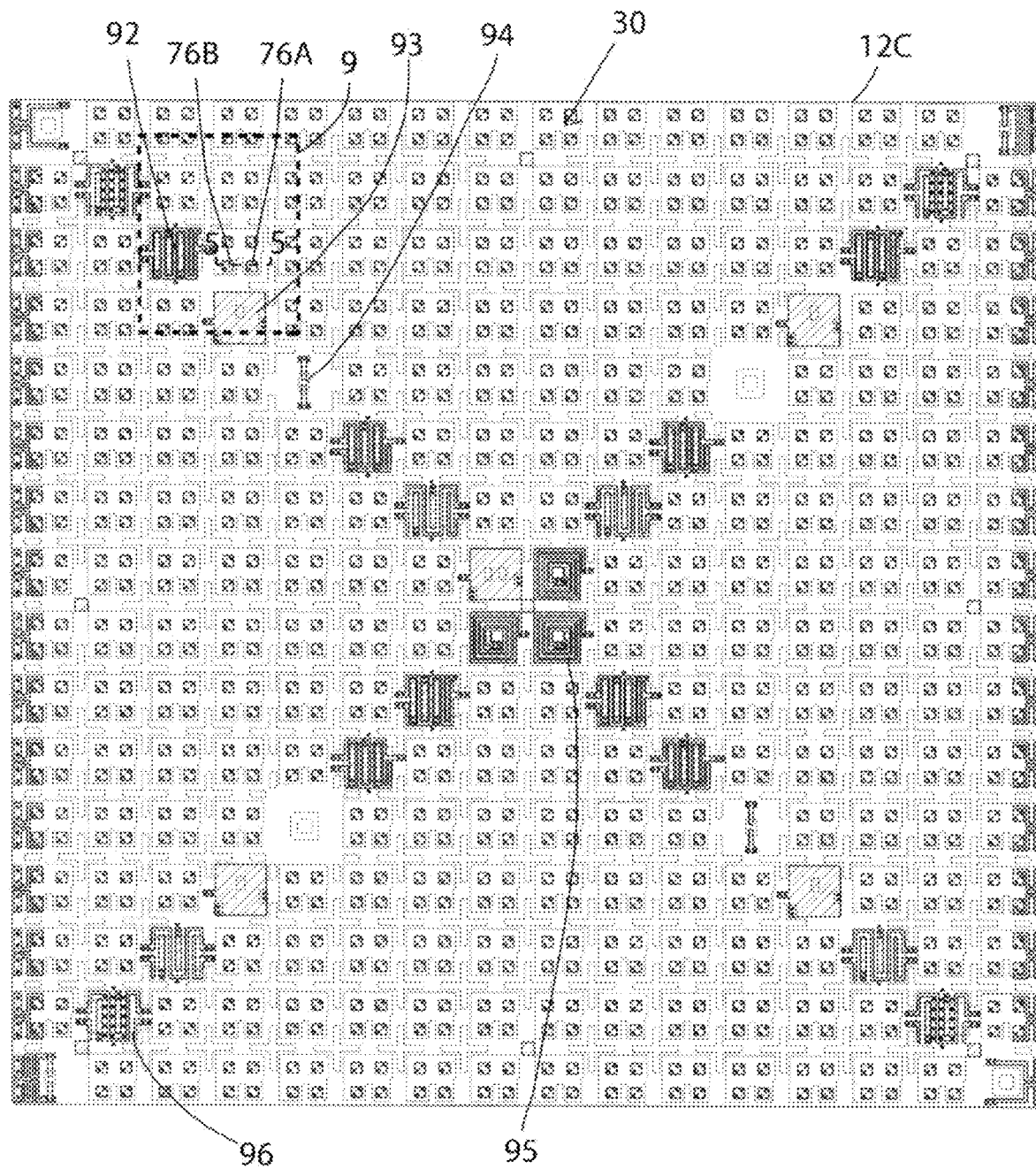
FIG. 8 is a top view of a portion of the switching structure of FIG. 2 in accordance with an embodiment of the present invention.

FIG. 8 is a top view of laminated film structure 12C in accordance with an embodiment of the present invention. What is shown in FIG. 8 are electrically conductive structures 76A and 76B of sensing elements 30, portions of fluid sensors 92, and portions of temperature sensors 94. Thus, in accordance with an embodiment, pressure sensors 30, fluid sensors 92 and temperature sensors 94 are integrated into a flexible sensing structure. It should be noted that other types of sensors can be integrated into the flexible sensing structure including inductive coils 95, capacitive sensing elements 93, resistive sensing elements 96, or the like.

Figure 9:
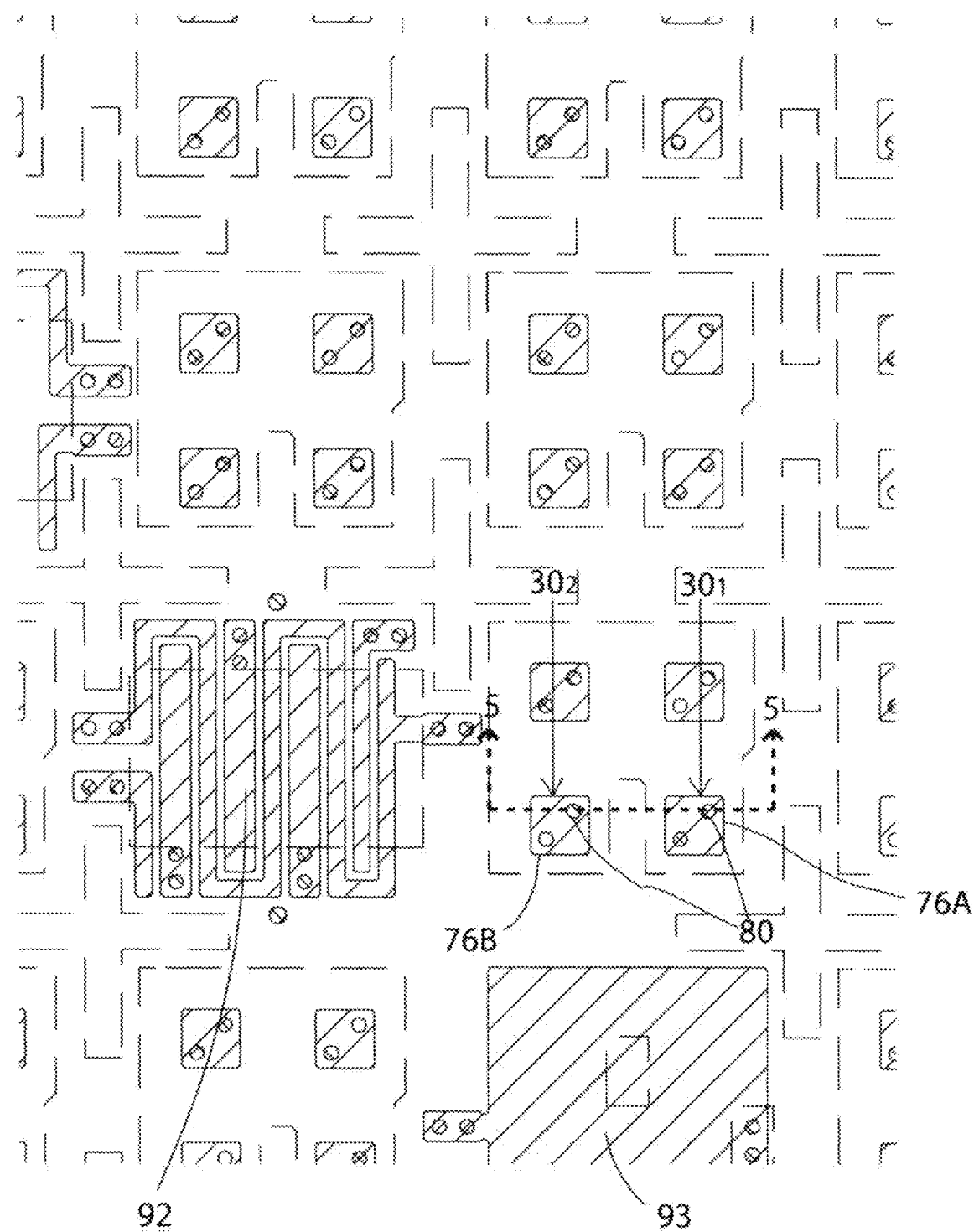
FIG. 9 is an exploded top view of the portion of the switching structure of FIG. 2 bounded by the broken line box of FIG. 8.

FIG. 9 is an exploded top view of the portion of the laminated film structure 12C bounded by broken line 9 of FIG. 8. FIG. 9 further shows electrically conductive portions 76A of switching element $30_1$, electrically conductive portions 76B of switching element $30_2$, and vias 80. It should be noted that vias 80 are positioned to be laterally shifted from vias 60. For the sake of completeness, the location of sensing elements $30_1$ and $30_2$ are pointed out.

Figure 10:
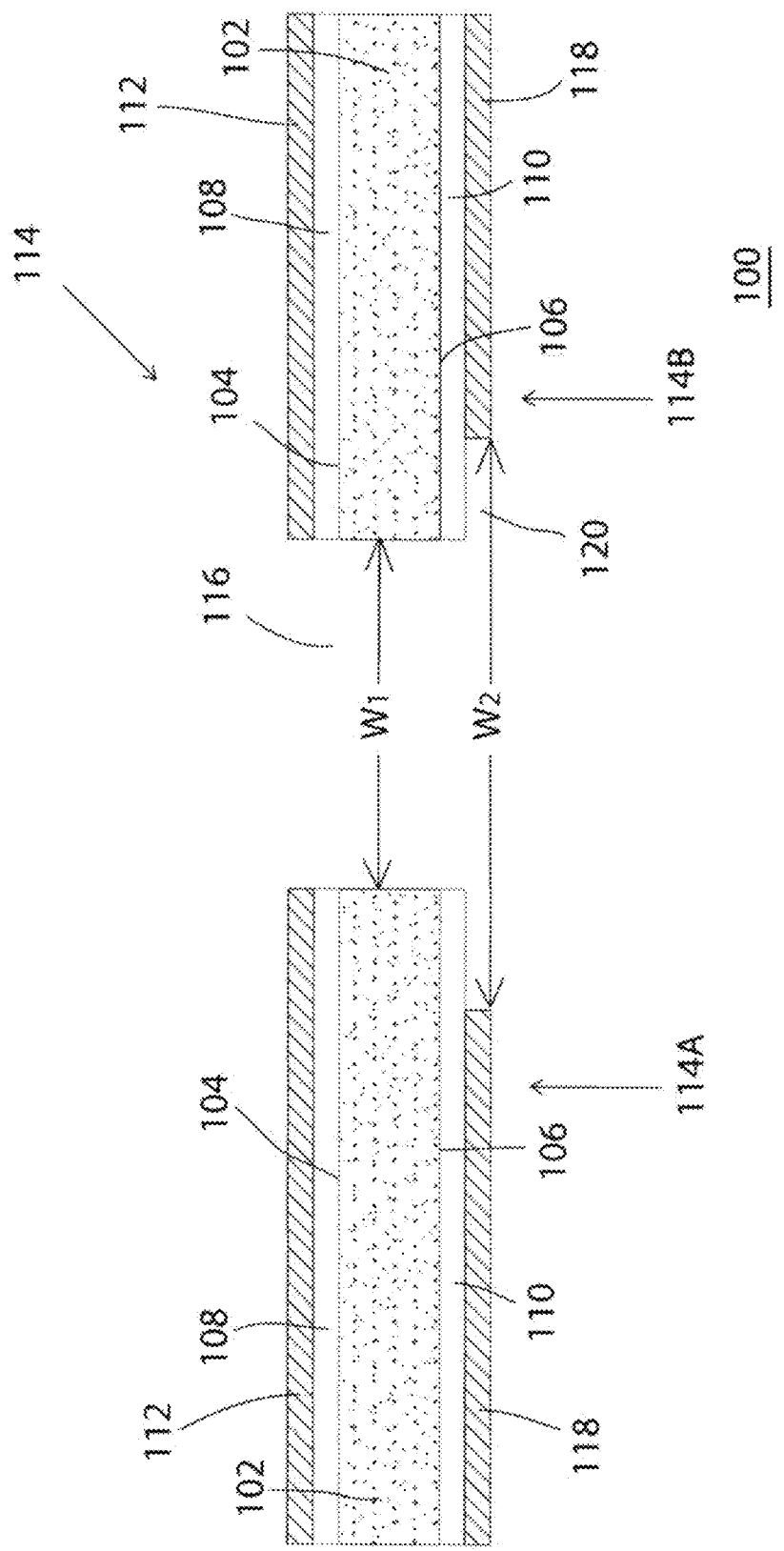
FIG. 10 is a cross-sectional view of a film sensor at an early stage of manufacture in accordance with another embodiment of the present invention.

FIGS. 10-19 illustrate a cross-sectional view of a film power device 100 fabricated from a flexible substrate and configured to include a fluid cooling structure in accordance with another embodiment of the present invention. What is shown in FIG. 10 is a cross-sectional view of a support substrate 102 of film power device 100 at a beginning stage of manufacture. Support substrate 102 has a surface 104 and a surface 106. By way of example, support substrate 102 is a polyimide film sold under the trademark Kapton® and has a thickness of about 5 mils. A high temperature adhesive layer 108 is formed on surface 104 and a high temperature adhesive layer 110 is formed on surface 106. Suitable materials for adhesive layers 108 and 110 include but are not limited to, polyimide, polybenzimadole, their co-polymers, and the like. An electrically conductive material 112 such as, for example, a one ounce copper foil is formed on adhesive layer 108 and an electrically conductive material 118, such as, for example, a one ounce copper foil is formed on adhesive layer 110. Support substrate 102, adhesive layers 108 and 110, and electrically conductive material 112 and 118 form a support structure 114. Although the material for electrically conductive materials 112 and 118 has been described as being copper, this is not a limitation. Other suitable materials include conductive carbon, graphite, or cuprates such as, for example, $Bi_2Sr_2Ca_2Cu_3O_{10}$ (BSCCO), or the like.

Still referring to FIG. 10, an opening 116 having a dimension $W_1$ is formed in support structure 114 using, for example, a router. For the sake of clarity, reference characters 114A and 114B have been used to identify portions of support structure 114 after formation of opening 116. It should be understood that after formation of opening 116, portions 114A and 114B of support substrate 114 are still connected as a single film through other portions of support structure 114. A portion of copper foil 118 is removed using, for example, a router to form an opening 120 that exposes portions of adhesive layer 110. It should be noted that opening 120 exposes portions of adhesive layer 110 of portions 114A and 114B of support structure 114. In accordance with an example, opening 120 has a dimension $W_2$ that is greater than dimension $W_1$, wherein openings 116 and 120 have a center point at approximately the same horizontal location.

Figure 11:
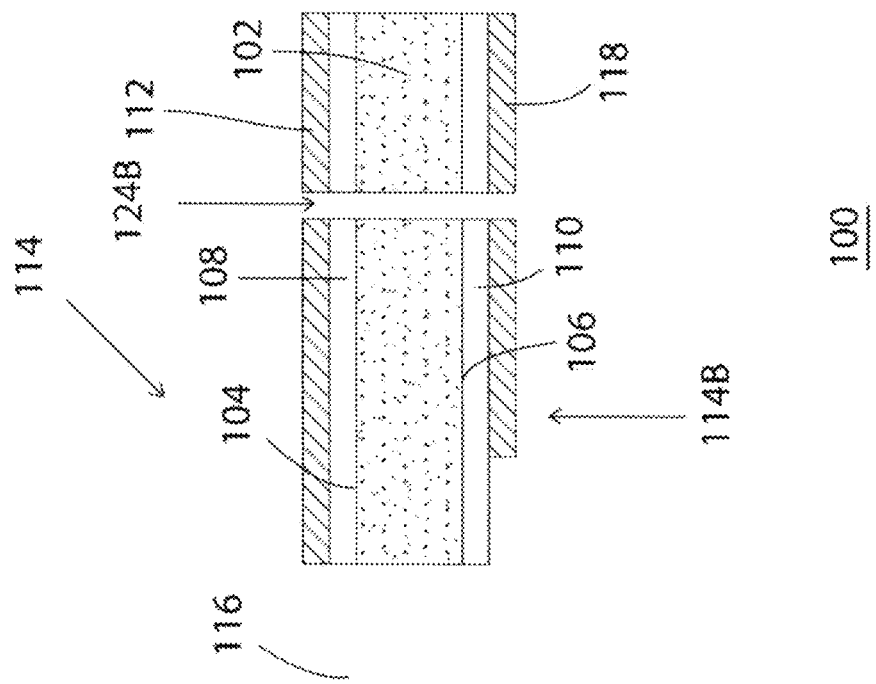
FIG. 11 is a cross-sectional view of the film sensor of FIG. 10 at a later stage of manufacture in accordance with another embodiment of the present invention.
Figure 11:
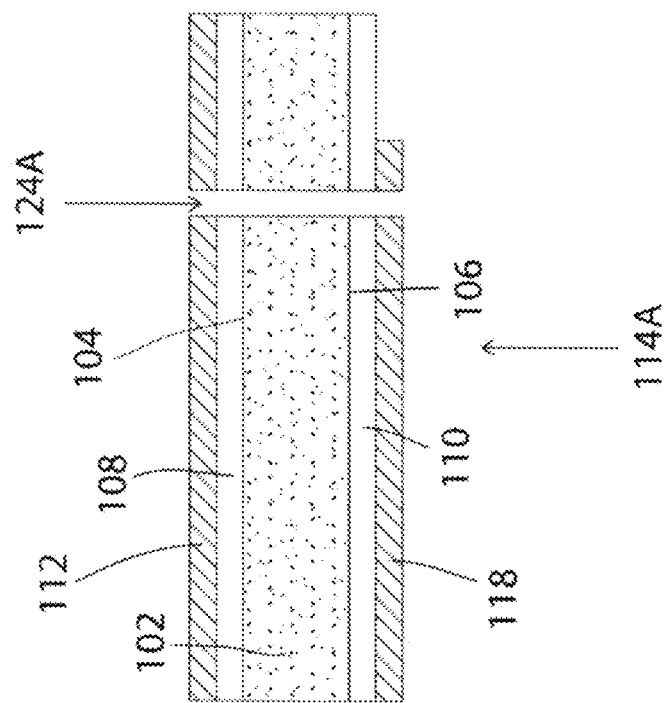

Referring now to FIG. 11, vias 124A and 124B are formed in portions 114A and 114B of support structure 114, respectively. Vias 124A and 124B may be formed using drilling, laser drilling, laser cutting, etching, or the like.

Figure 12:
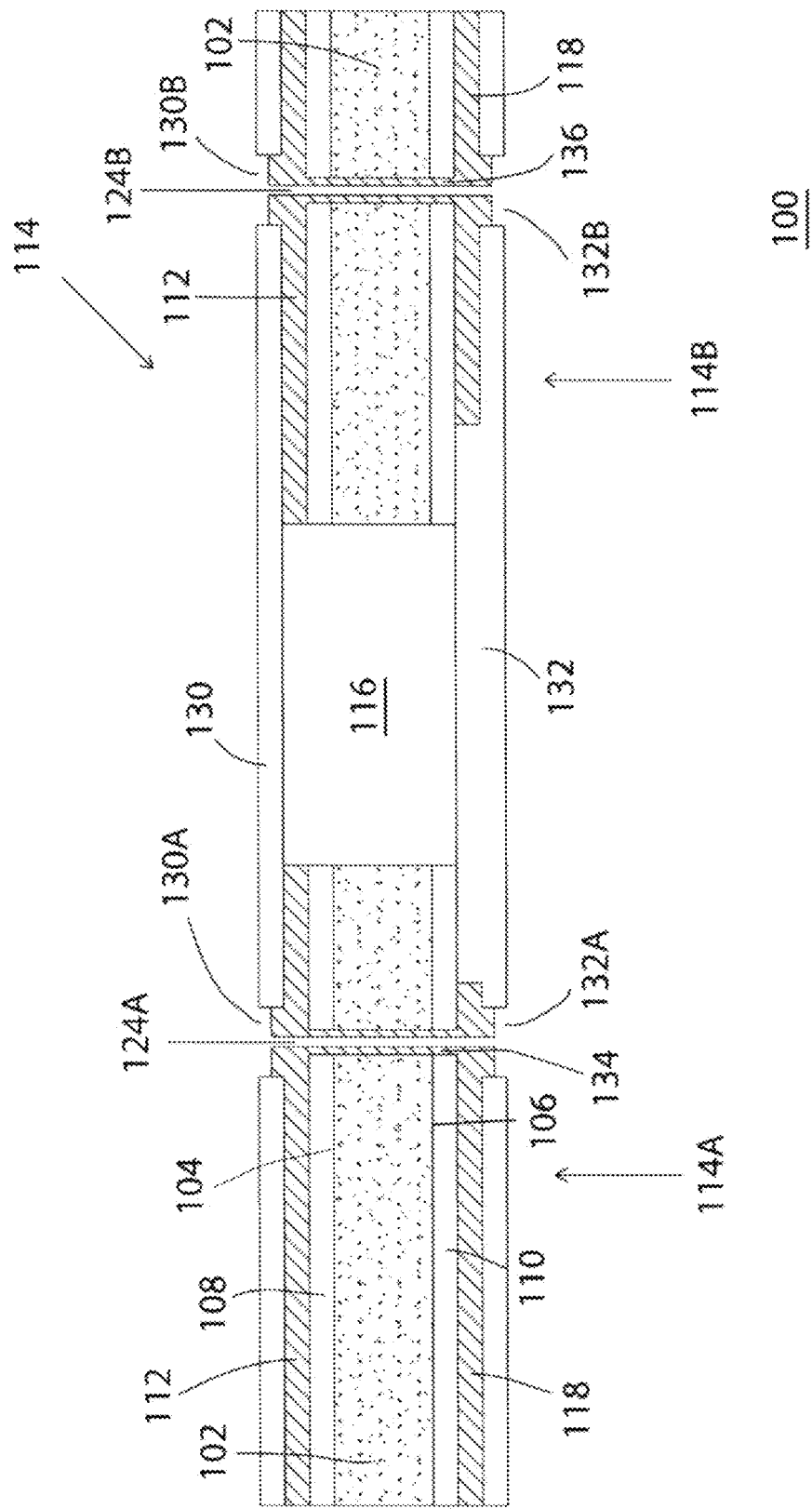
FIG. 12 is a cross-sectional view of the film sensor of FIG. 11 at a later stage of manufacture in accordance with another embodiment of the present invention.

Referring now to FIG. 12, a masking structure 130 is formed on electrically conductive material 112. Masking structure 130 has openings 130A and 130B that expose vias 124A and 124B and portions of electrically conductive material 112 adjacent vias 124A and 124B, respectively. A masking structure 132 is formed on electrically conductive material 118. Masking structure 132 has openings 132A and 132B that expose vias 124A and 124B and portions of electrically conductive material 118 adjacent vias 124A and 124B, respectively. An electrically conductive material 134 is formed along the exposed edges of support substrate 102 in portion 114A of support structure 114 and an electrically conductive material 136 is formed along the exposed edges of support substrate 102 in portion 114B of support structure 114. By way of example, electrically conductive material 134 and 136 is copper formed using an electroplating technique. It should be noted that the electrically conductive material is also plated onto the portions of electrically conductive material 112 and 118 adjacent to vias 124A and 124B that are unprotected by masking structures 130 and 132 to increase the thickness of the electrically conductive material in these regions.

Figure 13:
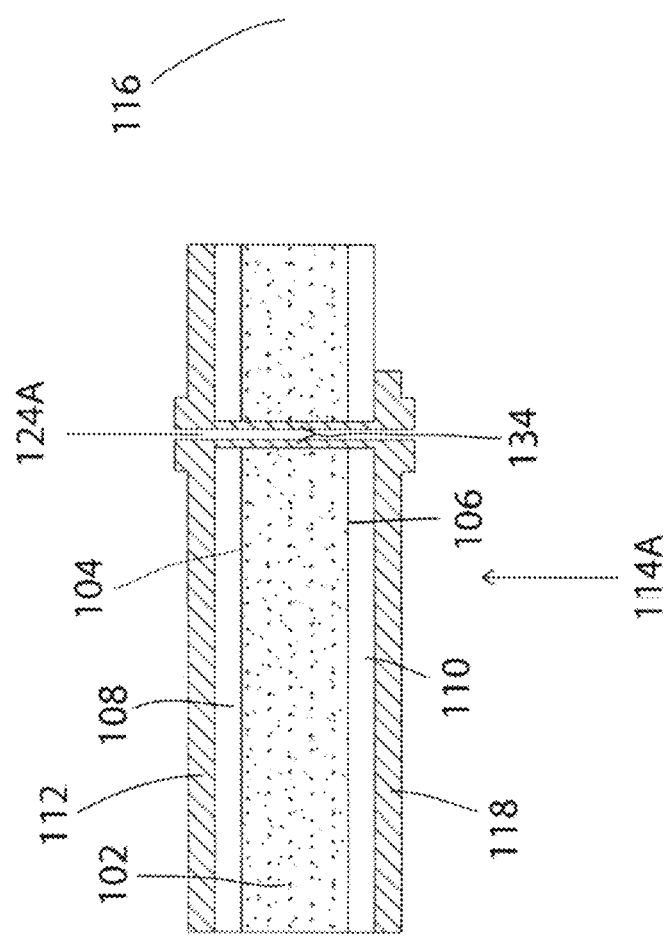
FIG. 13 is a cross-sectional view of the film sensor of FIG. 12 at a later stage of manufacture in accordance with another embodiment of the present invention.
Figure 13:
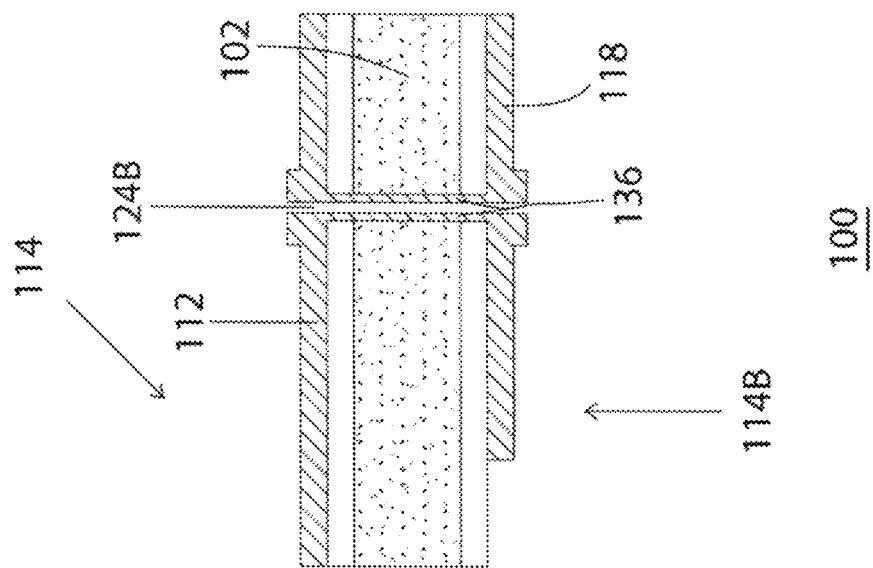

Referring now to FIG. 13, masking structures 130 and 132 are removed.

Figure 14:
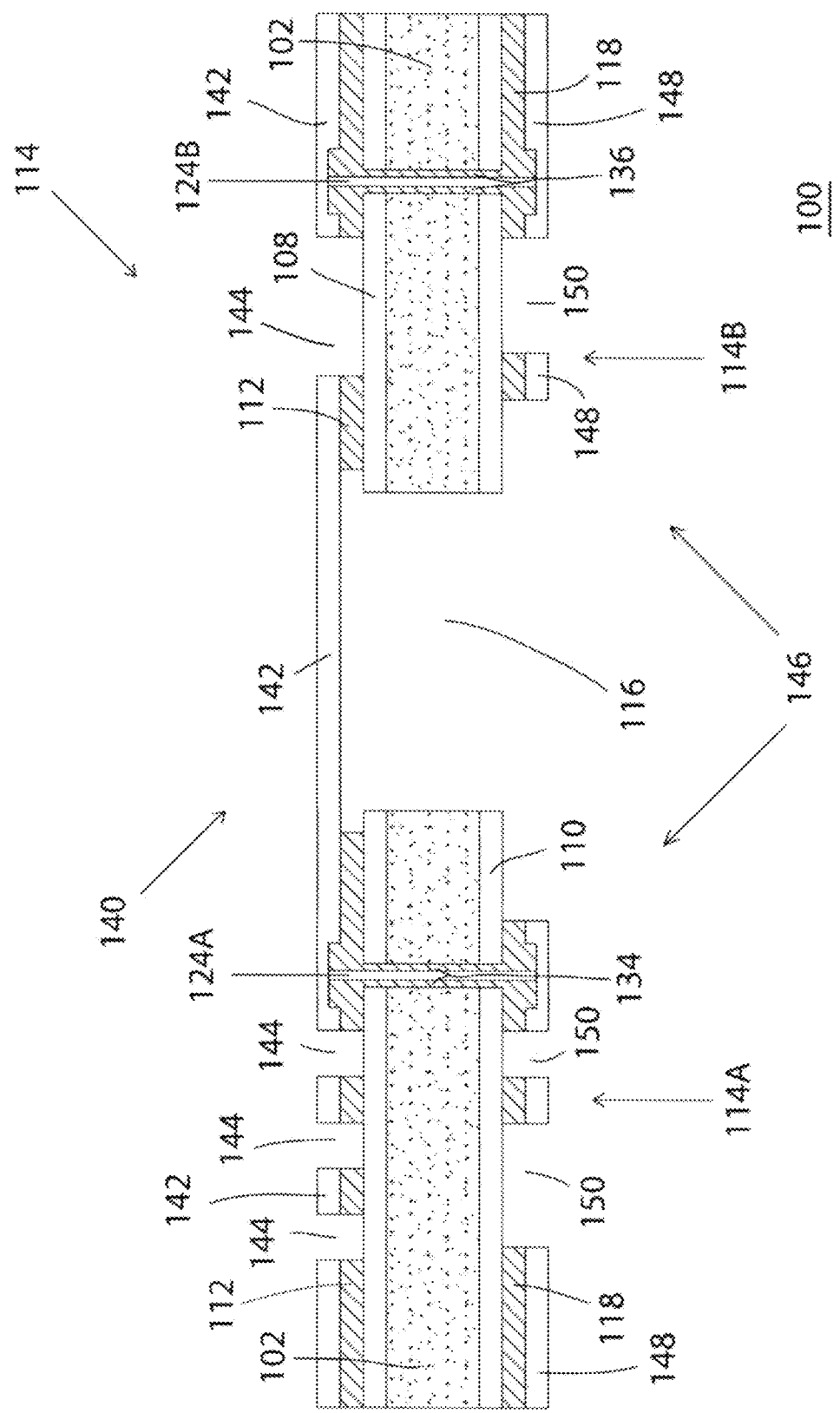
FIG. 14 is a cross-sectional view of the film sensor of FIG. 13 at a later stage of manufacture in accordance with another embodiment of the present invention.

Referring now to FIG. 14, a masking structure 140 having masking elements 142 and openings 144 is formed on electrically conductive material 112, opening 116, and vias 124A and 124B. Openings 144 expose portions of electrically conductive layer 112. A masking structure 146 having masking elements 148 and openings 150 is formed on electrically conductive layer 118 and may cover opening 116. Openings 150 expose portions of copper foil 118. The portions of copper foil 112 exposed by openings 144 are removed to expose portions of adhesive layer 108 and the portions of copper foil 118 exposed by openings 150 are removed to expose portions of adhesive layer 110.

Figure 15:
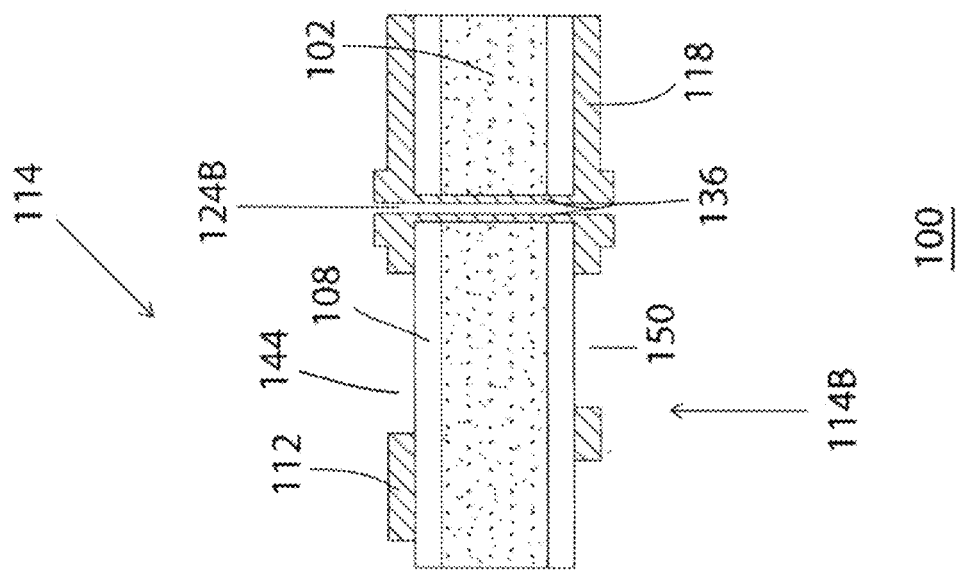
FIG. 15 is a cross-sectional view of the film sensor of FIG. 14 at a later stage of manufacture in accordance with another embodiment of the present invention.
Figure 15:
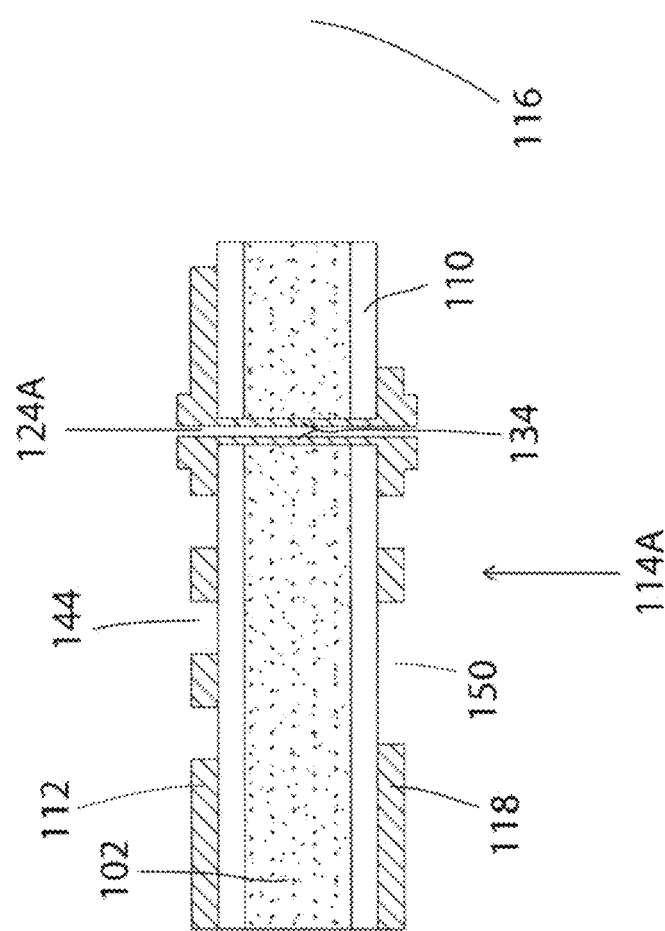

Referring now to FIG. 15, masking elements 142 and 148 are removed.

Figure 16:
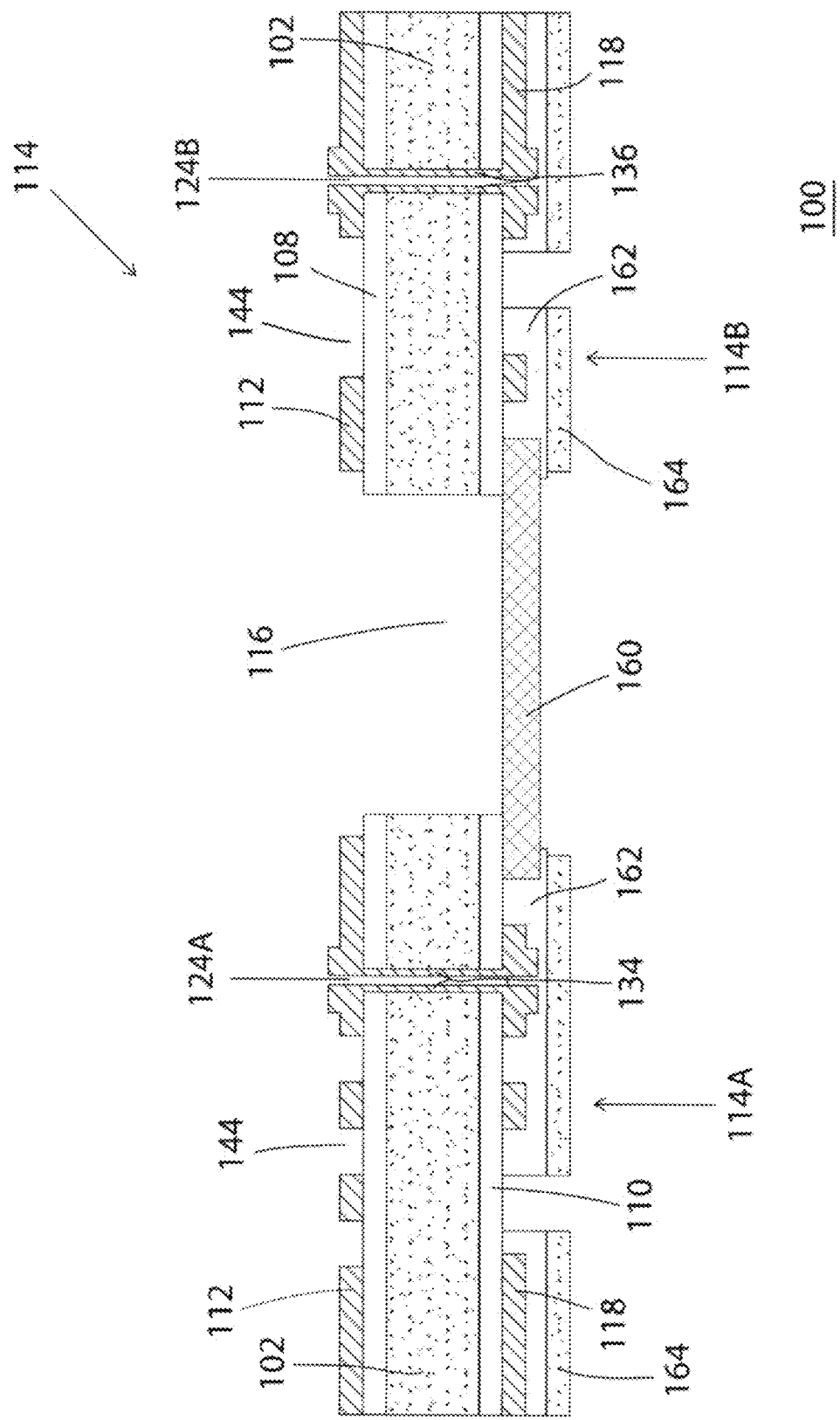
FIG. 16 is a cross-sectional view of the film sensor of FIG. 15 at a later stage of manufacture in accordance with another embodiment of the present invention.

Referring now to FIG. 16, a layer of glass 160 having a thickness of, for example, 2 mils is placed over adhesive layer 110 to cover opening 116 and an adhesive layer 162 having a thickness of, for example, 2 mils is formed over electrically conductive material 118 and portions of glass layer 160. A polyimide film 164 is formed on adhesive layer 162. By way of example, polyimide film 164 is a film sold under the trademark Kapton® and has a thickness of 1 mil. Alternatively, layer 160 may be a thermally conductive, electrically insulating material such as aluminum nitride, alumina, silicon carbide, silicon, etc. It should be noted that layer 160 may have a solderable copper layer so that a solder die attach material can be used instead of an epoxy die attachment material.

Figure 17:
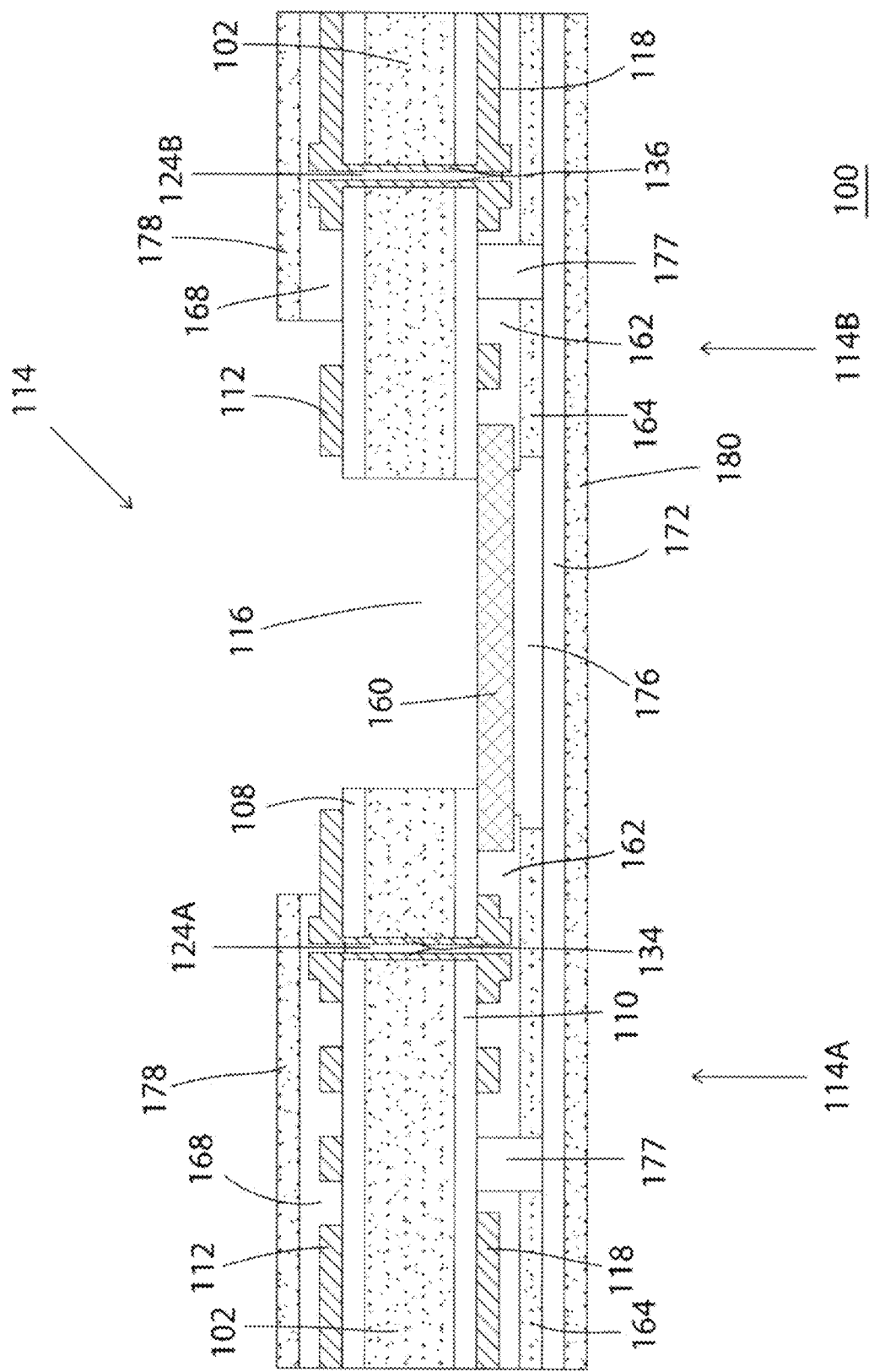
FIG. 17 is a cross-sectional view of the film sensor of FIG. 16 at a later stage of manufacture in accordance with another embodiment of the present invention.

Referring now to FIG. 17, an adhesive layer 172 having a thickness of, for example, 2 mils is formed on polyimide layer 164 and over glass layer 160. It should be noted that adhesive layer 172 is spaced apart from glass layer 160 to form a channel 176. Adhesive layer 172 forms channels 177 over adhesive layer 110. Channels 177 may be capillary sized channels. A polyimide layer 180 having a thickness of, for example, 1 mil, is formed on adhesive layer 172. In accordance with an embodiment, adhesive layer 172 and polyimide layer 180 may form a film and adhesive layer 168 and polyimide layer 178 may form a film.

An adhesive layer 168 having a thickness of, for example, 1 mil is formed over electrically conductive material 112, over the portions of adhesive layer 108 that are exposed, and over vias 124A and 124B. A polyimide layer 178 having a thickness of, for example, 1 mil, is formed on adhesive layer 168. Like adhesive layer 172 and polyimide layer 180, adhesive layer 168 and polyimide layer 172 may form a film.

Figure 18:
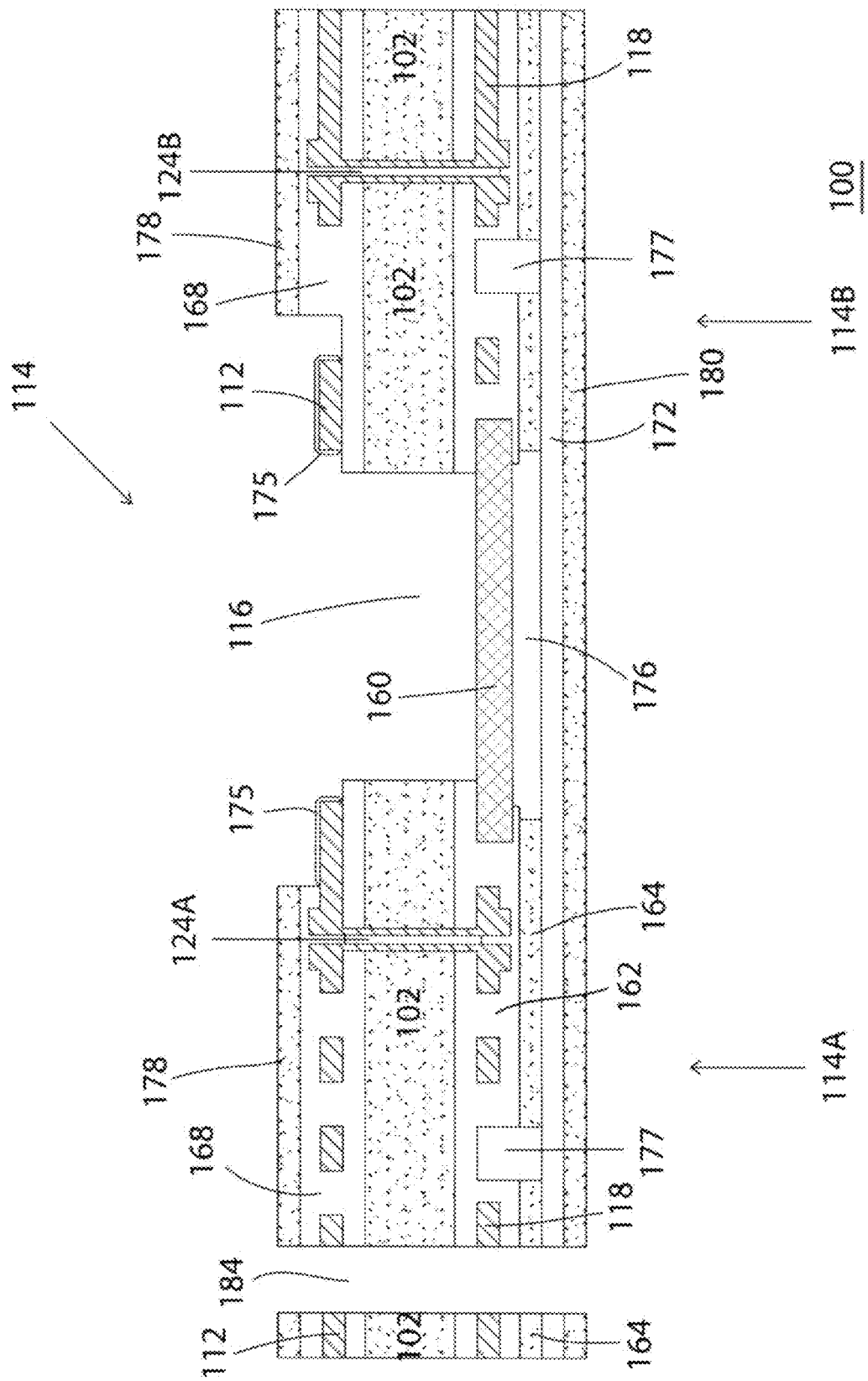
FIG. 18 is a cross-sectional view of the film sensor of FIG. 17 at a later stage of manufacture in accordance with another embodiment of the present invention.

Referring now to FIG. 18, an electrically conductive material 175 is formed on the exposed portions of electrically conductive material 112. By way of example, electrically conductive material 175 is comprised of a nickel, palladium, gold metallization system in which nickel is electroplated on the exposed portion of electrically conductive material 112, palladium is electroplated on the nickel, and gold is electroplated on the palladium. This combination of metals allows gold ball bonding. A cut line 184 may be formed through support structure 114. Alternatively, the film electronics may also be drilled and singulated.

Figure 19:
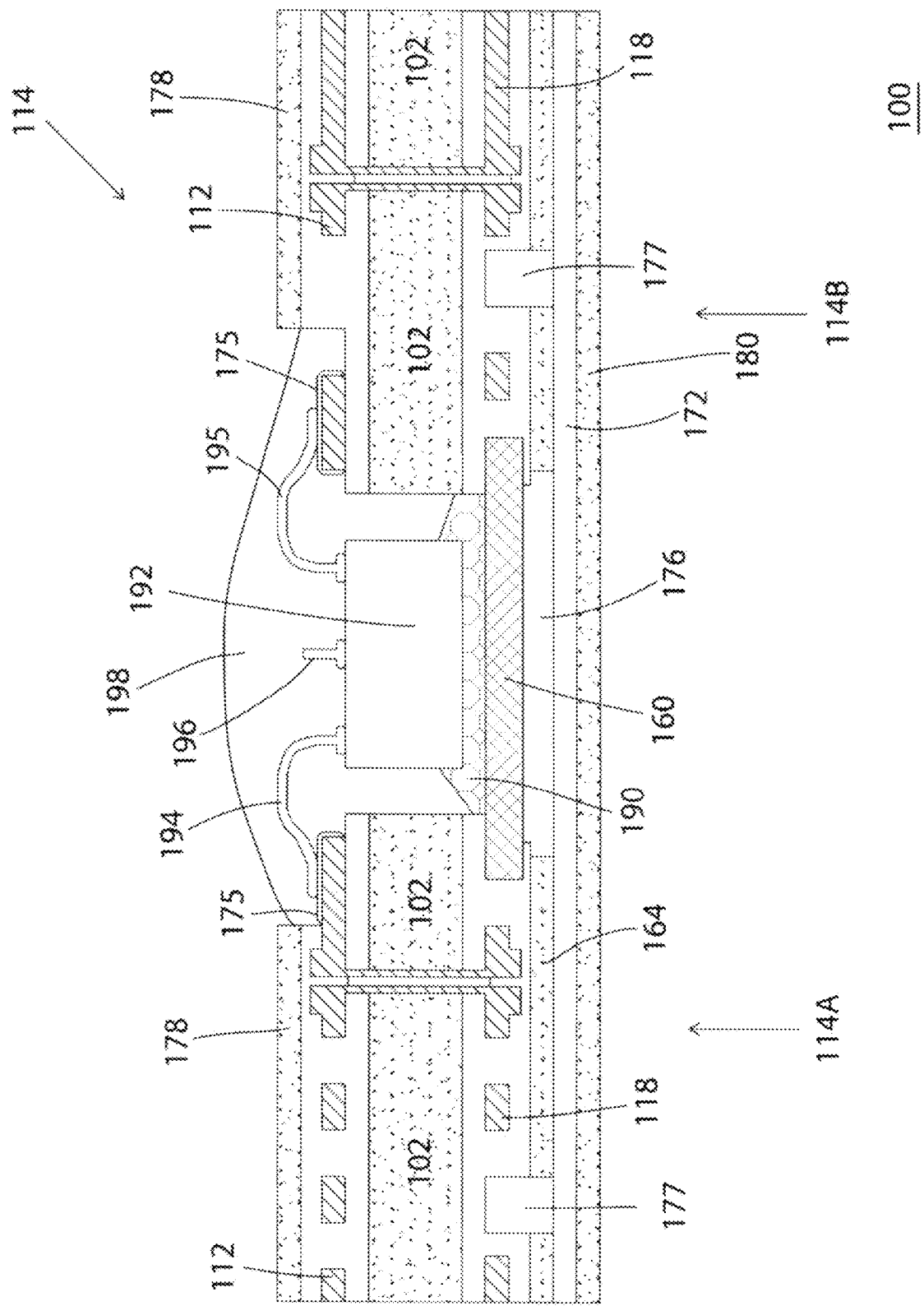
FIG. 19 is a cross-sectional view of the film sensor of FIG. 18 at a later stage of manufacture in accordance with another embodiment of the present invention.

Referring now to FIG. 19, a conductive adhesive 190 is formed on glass layer 160. A semiconductor chip 192 is bonded to glass layer 160 through conductive adhesive 190. In accordance with an embodiment, a Metal Oxide Semiconductor Field Effect Transistor (MOSFET) is formed from semiconductor chip 192. Semiconductor chip 192 includes a drain that is electrically coupled to electrically conductive materials 112 and 175 through a bonding wire or wirebond 194 in portion 114A of electrically conductive structure 114 and a source that is electrically coupled to electrically conductive materials 112 and 175 through a bonding wire or wirebond 195 in portion 114B of support structure 114. For the sake of completeness, FIG. 19 further illustrates a portion of a bonding wire or wirebond 196 that is bonded to a gate of semiconductor chip 192. A protective material 198 such as, for example, silicone, or glob-top may be dispensed over wirebonds 194, 195, and 196 and semiconductor chip 192 to protect them from environmental stresses. Protective material 198 may be referred to as a protective encapsulant material or an encapsulant material. Integrated fluid channel 176 is positioned next to glass layer 160 to rapidly conduct and convect heat away from semiconductor chip 192. Additional capillary fluid channels 177 are positioned within film electronic module 100 to spread, conduct, and convect heat to or away from other devices embedded inside film electronic module 100. It should be noted that the cooling fluid passing through fluid channels 176 and 177 can be fluids in liquid form or fluids in gaseous form. Suitable liquid fluids include water, 100% ethylene glycol, acetic acid, n-nonane, styrene, n-butyl alcohol, or the like, or combinations thereof. In addition, additives may be included.

Figure 20:
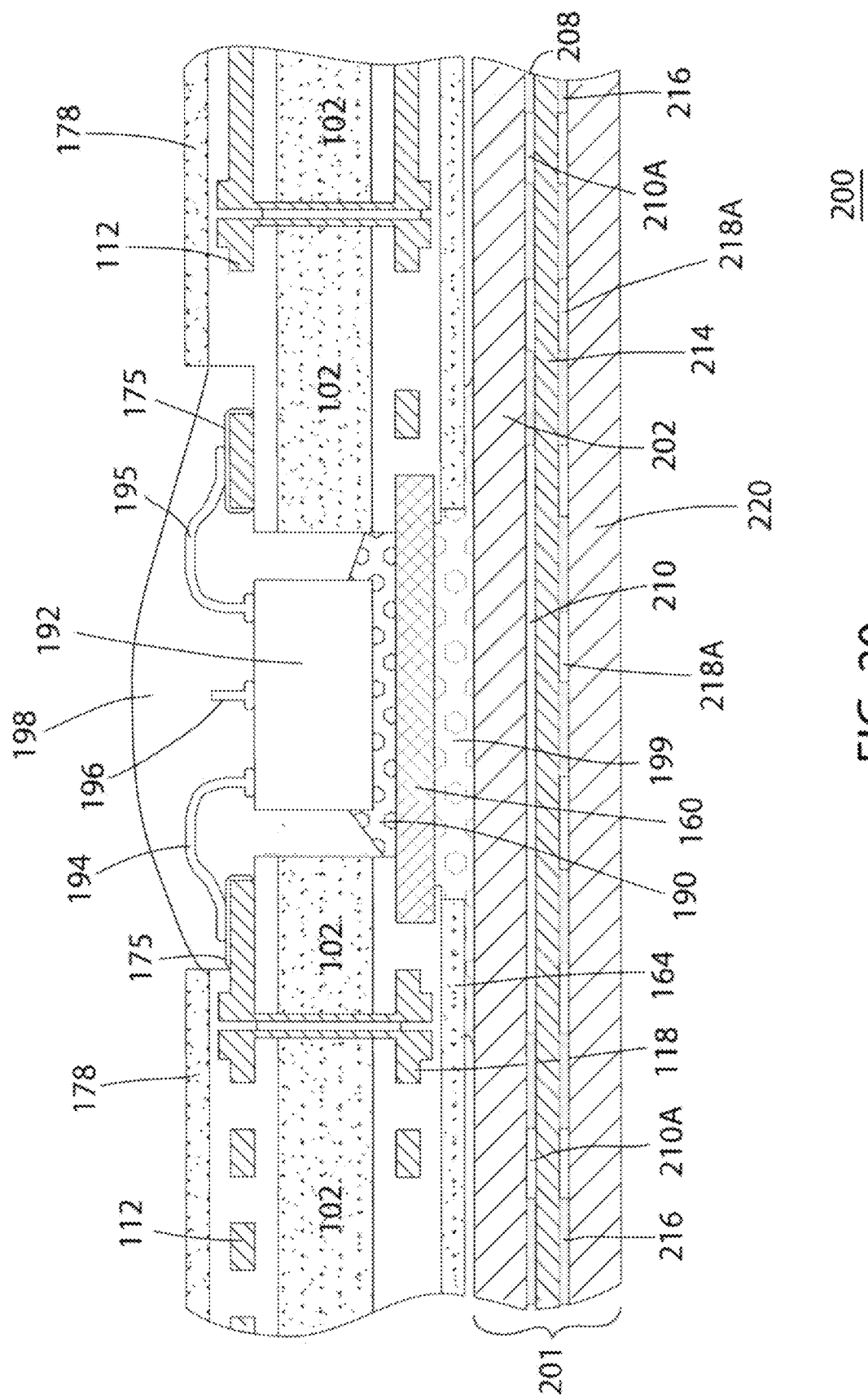
FIG. 20 is a cross-sectional view of a film sensor in accordance with another embodiment of the present invention.

FIG. 20 illustrates a cross-sectional view of a film power device 200 fabricated from a flexible substrate and configured to include a fluid cooling structure in accordance with another embodiment of the present invention. Film power device 200 is similar to film power device 100 except that channels 177, adhesive layer 172, and polyimide layer 180 are absent from film power device 200. Channels 177 are replaced by channels 210A and 218A within cooling structures 201. Layers 172 and 180 of film power device 100 have been replaced by anodized materials 202, 214, and 220, and adhesive layers 208 and 216. Channels 176 are replaced with a thermally conductive grease 199 that is between glass layer 160 and aluminum 202. In accordance with an embodiment, cooling structure 201 is comprised of an aluminum foil 214 bonded to aluminum foil 202 using strips of adhesive material 208. Cooling structure 201 may be referred to as an aluminum cooling radiator. Narrow channels 210A and a wide channel 210 are formed between aluminum foil 214 and aluminum foil 202. Adhesive strips 208 are laterally spaced apart to form channel 210 as a wide channel and to form channels 210A as narrower channels compared to channel 210. Aluminum foil 214 is bonded to anodized aluminum foil 220 using adhesive strips 216. Capillary channels 218A are formed between adhesive strips 216 and between aluminum foil 214 and anodized aluminum foil 220. Adhesive strips 216 are laterally spaced apart from each other to form capillary channels 218A.

Still referring to FIG. 20, adhesive strips 208 are positioned so that channel 210 is formed between aluminum foil 202 and aluminum foil 214 that is larger than channels 210A and are aligned with semiconductor chip 192, glass layer 160, and thermally conductive grease 199. By way of example, adhesive strips 208 and 216 are 1 mil thick, aluminum foil 214 is 5 mils thick and aluminum foils 202 and 220 are 11 mils thick. Aluminum foils 202 and 220 and anodized aluminum foil 220 cooperate to form an aluminum casing.

In operation, a cooling fluid such as, for example, water flows through channels 210, 210A, and 218A to spread or to remove heat generated by semiconductor chip 192 and other electronic circuits that may be coupled to semiconductor chip 192. Capillary channels 210A and 218A may help pull the cooling fluid through them.

Channels 210, 210A, and 218A are intended to be filled with fluid, vacuum pumped down to evacuate air and other volatile gases and then the edges of the aluminum are welded to seal the fluid and its vapor inside and to create a partial vacuum. Channels 210, 210A, and 218A allow a tiny amount of fluid trapped inside them to vaporize 100% without bloating its thin aluminum casing. The narrow channels, thin adhesives, a partial pressure of the fluid prevent the thinned out aluminum casing from collapsing during vacuum pump down.

It should be noted that film power electronics such as, for example film power electronics 200 may be a module that includes many semiconductor chips and related drive circuits integrated with and embedded in laminated films. The laminated film separates the high voltage electronics embedded in the films from liquid or other fluids that serve as heat radiators. Power film modules such as power film module 200 can bend and conform to the curvature of an aluminum cooling radiator 201 that can also bend to a desired shape. A common aluminum cooling radiator 201 can be used by all circuits and thermal generators associated with the film power electronic structure such as film power electronic structure 200. Fluid cooled systems in accordance with embodiments of the present invention are bendable and light weight because of the low volume of fluid within them. For example, 0.5 grams of water inside a one liter volume of a vacuum sealed cooling structure 380 can be used to cool a 10,000 Watt film power inverter module.

Figure 21:
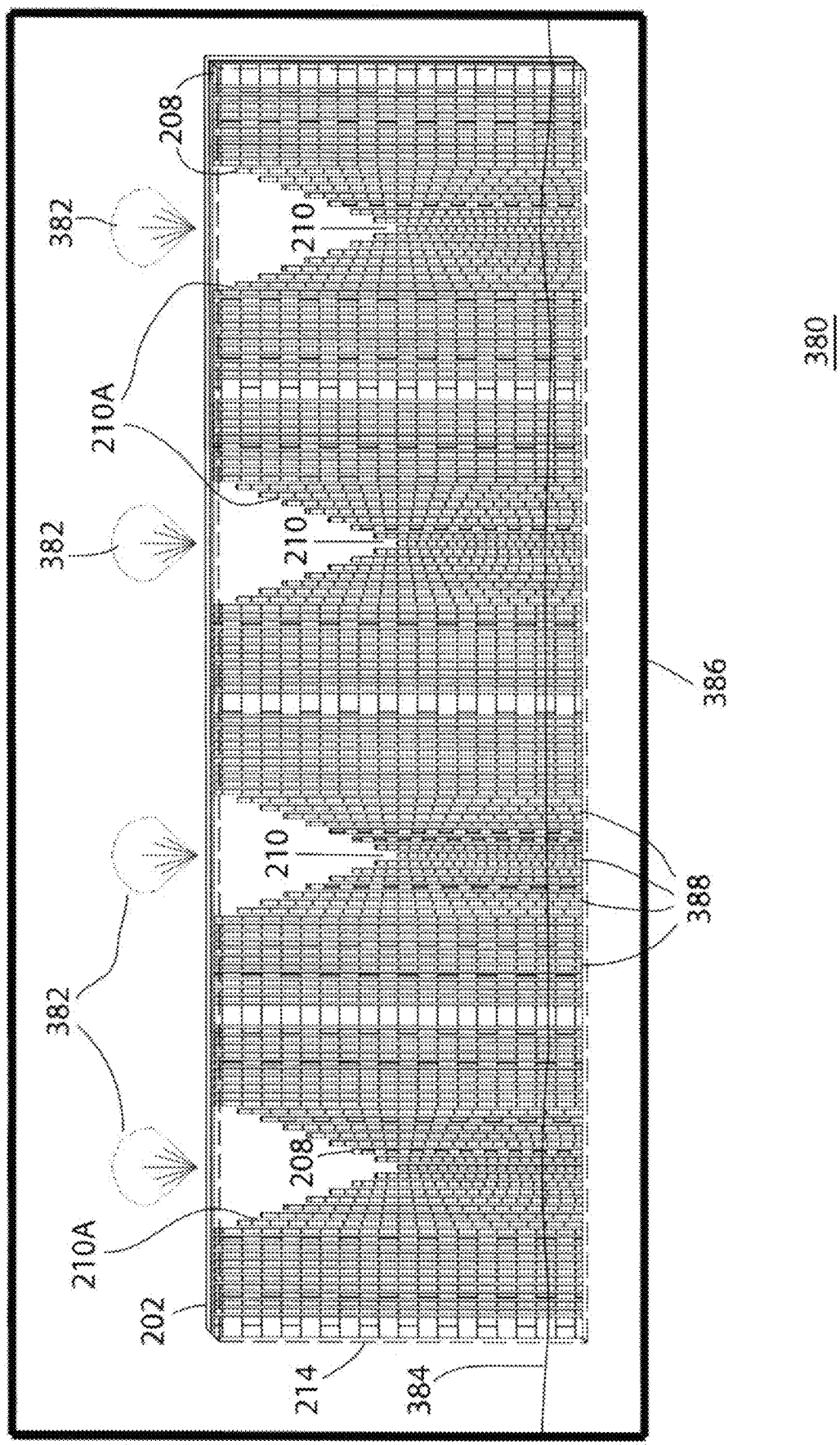
FIG. 21 is a view of film heat radiator in accordance with another embodiment of the present invention.

FIG. 21 is a view of a cooling structure 380 in accordance with an embodiment of the present invention. It should be noted that cooling structure 380 may be comprised of cooling structure 21 of FIG. 20. What is shown in FIG. 21 are cooling channels 210 and 210A configured for spreading and removing heat from four semiconductor chips such as, for example, semiconductor chip 192 shown in FIG. 19 or FIG. 20. The aluminum radiator allows water to vaporize into steam identified by reference character 382 which subsequently vents from channels 210. The heat of vaporization is 540 calories per gram of water (for embodiments in which the fluid is water) which provides a 1,700 times increase in the volume of water that turns into steam. The large volume of steam inside an aluminum radiator condenses on large aluminum surface areas and returns to be re-used as cooling water 384 in a vacuum sealed aluminum casing 386. Water is pulled in through capillary channels 210A along entry holes 388 or through capillary channels 218A. The heat capacity of water is 1 calorie per gram to raise the temperature by one degree Celsius. Thus, 540 calories are needed to vaporize 1 gram of water into steam. Cooling structure 380 allows building a cooling structure that uses less water and has a lighter weight because the cooling structure can be manufactured in view of the heat of vaporization of water as well as water's heat capacity to transport, convect, and conduct heat.

Figure 22:
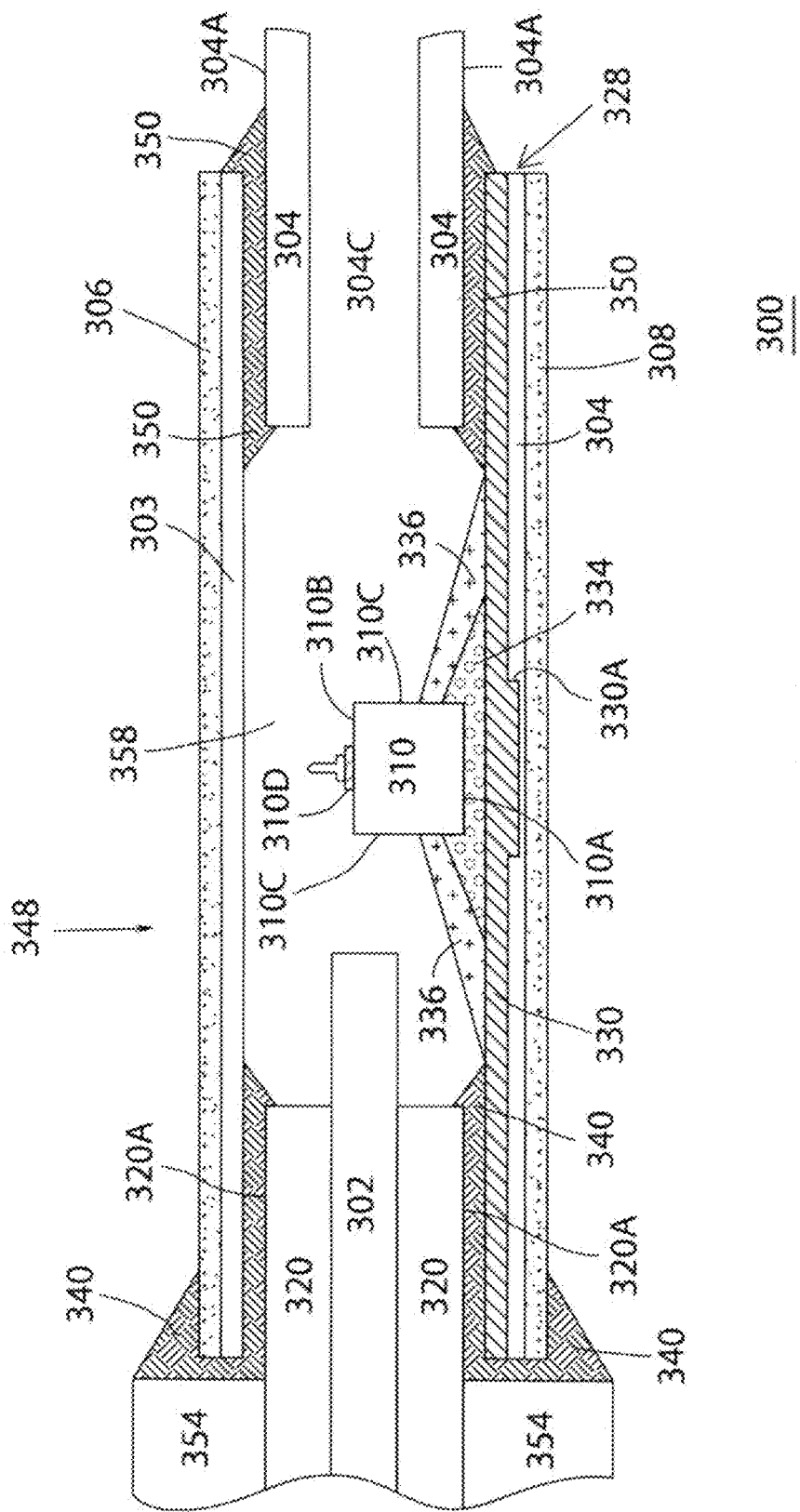
FIG. 22 is a cross-sectional view of a film sensor in accordance with another embodiment of the present invention.

FIG. 22 illustrates a cross-sectional view of a multi-function sensor 300 in accordance with an embodiment of the present invention. More particularly, FIG. 22 illustrates a sensor configured to monitor an optical signal and a fluid, i.e., an optical sensor and a fluid sensor integrated into a single film. Thus, multi-function sensor 300 includes an optical fiber 302 and a single lumen plastic tube 304 that are inserted or formed between polyimide films 306 and 308 and laterally spaced apart from a light source 310. By way of example, light source 310 is a light emitting diode (LED) Integrating multiple sensor functions into a single sensor allows more than a single parameter to be sensed. For example, multi-function sensor 300 may be used to measure the size and number of red blood cells in a blood sample. Optical fiber 302 and light source 310 can be configured to count the number and estimate the size of each of the red blood cells passing by optical fiber 302 and light source 310. Light source 310 may be a silicon based semiconductor die having a surface 310A and a surface 310B, wherein surface 310B may include a polyimide passivation layer, gold plated pad 310D over aluminum bond pad, and fluorescence activating nano-rods.

Multi-function sensor 300 includes optical fiber 302 having a refractive index $\eta_1$ formed within and extending from a cladding 320 having a refractive index $\eta_2$, where refractive index $\eta_1$ is greater than refractive index $\eta_2$. Cladding 320 has a surface 322 and a surface 324. Tubing 304 has an exterior surface 304A, an exterior surface 304B, and a channel 304C. As those skilled in the art appreciate, cladding 320 may be comprised of a single layer of material or a plurality of layers of material.

Multi-function sensor 300 includes a support structure 328 on which light source 310 is mounted. By way of example, support structure 328 is comprised of a copper film 330 having a protrusion 330C. An adhesive film 304 is formed on a bottom surface and a polyimide film 308 is formed on adhesive film 304.

Light source 310 is coupled to copper film 330 by a thermally conductive die attach material 334. A protective material is formed over portions of copper layer 330 and thermally conductive die attach material 334. Support structure 328 is attached to adhesive 303 and polyimide 306 by a layer that is not visible in FIG. 21 because it is off-plane in FIG. 21 (the layer that is not visible may be a laminate film structure having a thickness ranging from about 160 micrometers to about 300 micrometers.

Multi-function sensor 300 further includes a film structure 348 that covers chamber 358 and layers, wire bond pads, and bond wires that are connected to light source 310. Multi-function film sensor has multiple ports where tubing 304, optical fiber 320, and other tubing (not shown) can be inserted. By way of example, support structure 348 is comprised of a polyimide film 306 and polyimide film 308 that protect the components of FIG. 21.

Tube 304, optical fiber 302 and cladding 320 are inserted into film structure 348. Film structure 348 is bonded to surfaces 320A of cladding 320 and to surfaces 304A of tubing 304 by adhesive materials 340 and 350. Adhesive materials 340 and 350 can be silicone. Tubing 304, cladding 320, adhesive materials 340 and 350, and support structure 328 cooperate to form a sealed cavity 358.

Figure 23:
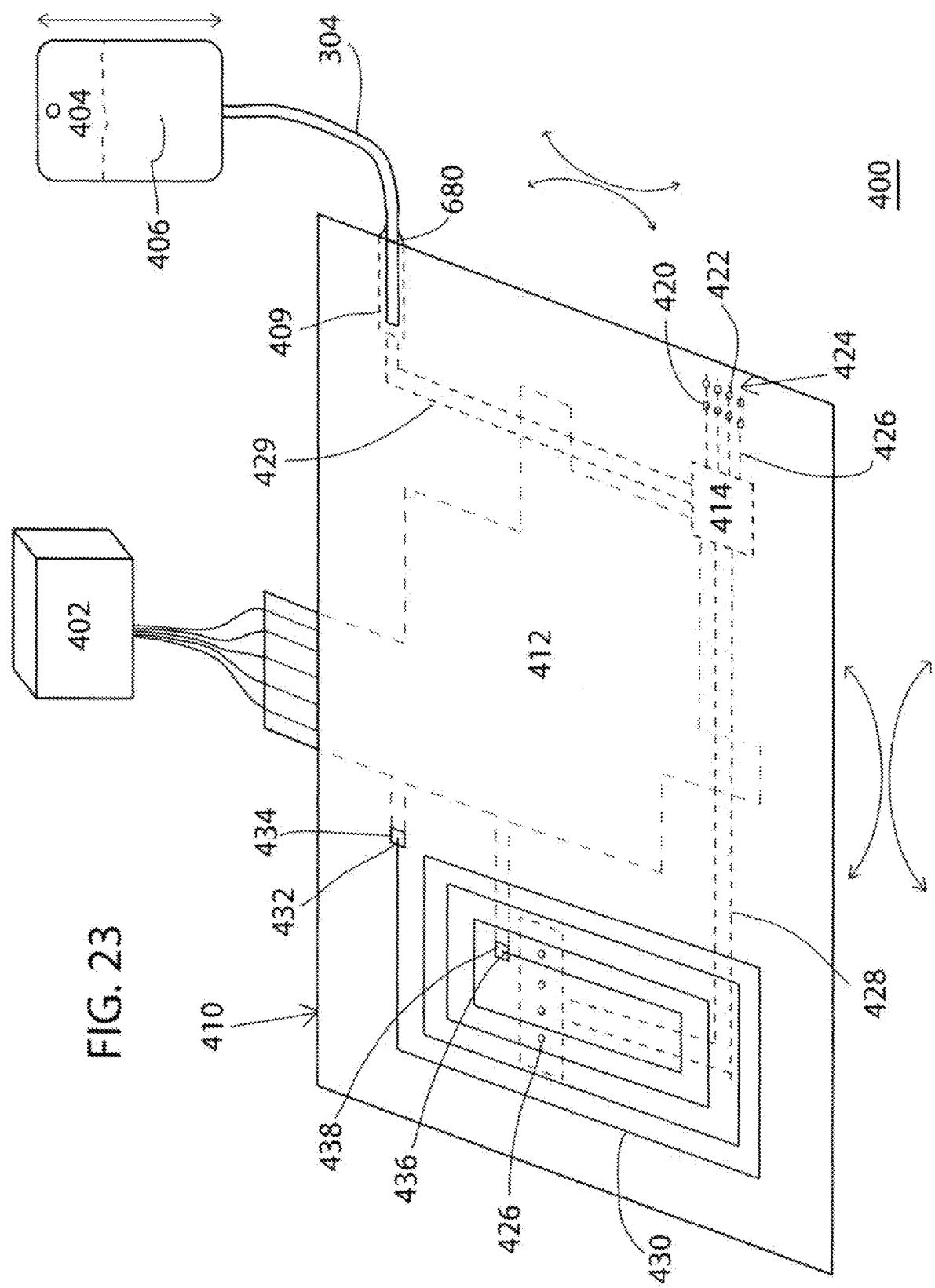
FIG. 23 is a view of film sensor in accordance with another embodiment of the present invention.

FIG. 23 is a top view of a film fluid monitor 400 connected to a power supply and other electronic circuitry housed in cabinet or box 402 and connected to a vertical elevation bladder 404. Film monitor 400 includes a film substrate 410. Integrated electronic component and circuits 412 and a chamber 414 are embedded inside film substrate 410. Integrated electronic component and circuits 412 may include circuitry configured to sense and compensate for temperature, pressure, humidity, and flow rates. Integrated electronic component and circuits 412 are positioned or located close to chamber 414, for example 150 micrometers or less. Inlet ports or inlet holes 422 are connected to chamber 414 through inlet channels 420. Chamber 414 may include other sensory devices configured to analyze one or more fluids flowing into inlet ports 420 though inlet channels 422 and into chamber 414. By way of example, inlet channels 420 are formed between two adhesive films and have dimensions of 20 mils by 12 mils. An analyte fluid droplet placed on any one of the inlet ports 422 of inlet channels 420 is drawn through inlet channels 420 and into chamber 414 for analysis. Capillary action pulls the fluid inside film substrate 410 through channels represented by broken lines 428.

Film fluid monitor 400 further includes an inlet channel 429 connected to an inlet port 409. A tube 304 such as, for example, a single lumen tube is inserted into inlet portion 409 and coupled to inlet channels 429 and sealed with an adhesive 680. By way of example, tube 304 connects a fluid storage structure or fluid bladder 404 that may contain a purging fluid and an enzyme indicated by reference character 406. Fluid storage structure 404 may be raised, lowered, or completely shut-off with a valve to regulate the flow of purging fluid from fluid storage structure 404 into chamber 414 though inlet channels 429. Outlet channels 428 allows fluid to flow out from chamber 414 through exhaust ports 427.

A carbon heater coil 430 has an end 432 coupled to an electrically conductive pad 434 and an end 436 coupled to an electrically conductive pad 438. By way of example, carbon heater coil 430 is embedded inside film substrate 410 and positioned to be above outlet channels 428. Suitable materials for electrically conductive pads 434 and 438 include copper, aluminum, plated copper, or the like. It should be noted that copper pads 434 are connected to copper pads 438 by copper traces to film electronics 412 that include a transistor to turn-on or turn-off carbon heater 430 depending on a temperature sensor embedded in film electronic 412. MOSFETs and heater coils are two types of power devices 15. Conductive pads 434 and 438 allow current to pass from copper lines (not shown) through carbon heater coil 430. The degree of heating is regulated by an electrical current, a fluid flow rate, and temperature sensor circuits embedded that are part of integrated electronic circuits 412 that are embedded in film substrate 410. Integrated electronic circuits 412 are electrically connected to a power supply and to other circuits that reside in box 402. A film to film connector 403 is electrically and mechanically connected to film substrate 410. As discussed above, the fluid flow rate can be regulated by adjusting the vertical elevation of fluid storage structure 404 relative to inlet channels 420 and relative to the height of outlet portions 427. Fluid can flow through the channels by capillary action plus the effect of gravity. Film substrate 410 bends and/or tilts to change the elevation of inlets relative to outlets to adjust the flow of analyte fluid from inlet ports 422 into chamber 414. Electronic sensing and regulation of the fluid flow rate out of chamber 414 through outlet channels 428 is accelerated through heat assisted evaporation of fluids by heater coil 430 and integrated electronic circuits 75. FIG. 23 illustrates an embodiment in which the integration of plastic tubing 304, liquid fluids, fluid channels, embedded electronics 412, sensing circuit 16, switching structure 12, and power devices 15 of FIG. 1 are all embedded inside film substrate 410. Film substrate 410 can be translucent or transparent to visible or infra-red light. The color of fluids and gas bubbles passing through channels 428 and 429 can be visually seen or detected by film electronics 412 under channels 428 and 429.

Those skilled in the art will realize that inductor coils and/or carbon resistors can be fabricated in a configuration similar to heater coil 430. Inductor coils consisting of a fine carbon line with many turns coiling along a top plane of film substrate 410 may be connected by a copper pad with a copper via to a bottom film layer of film substrate 410 with carbon line coils along the bottom plane of film substrate 410 to create a continuous inductor coil with a greater inductance value than two separated coils of the same surface area on a single plane. A fine carbon line, coil or serpentine line allows one to create higher resistance carbon resistors in or on film substrate 410. A Ultraviolet laser can be used to trim a carbon resistor to a desired resistor value, if needed. In addition, a printed carbon line can be added to selectively short adjacent copper pads in order to adjust the circuitry of selected circuits of electronic component and circuits 412 to add or increase capacitance, trim adjacent coils of an inductor coil, or to trim an inductance value, or to short devices of electronic component and circuits 412. In addition, a heater coil such as, for example, coil 430 can be embedded around chamber 413 to warm the fluid, the transducer device, and the enzyme to make the reactions more efficient.

In accordance with an embodiment, light emitting devices 604 are comprised of bare blue light emitting diodes that transmit optical signals having wavelengths ranging from about 445 nanometers to about 455 nanometers. Those skilled in the art realize that each protein or bio-molecule has a characteristic peak light absorption range of wavelengths. Light emitting diodes are produced that emit different wavelengths from blue to infrared wavelengths over 2,000 nanometers. The choice of light emitting diode and its brightness depends upon the molecule of interest and the penetration depth of light into tissue.

In operation, film substrate 602 and cotton cloth 610 are folded around an ear along a fold axis 24-24. Blue light emitting diodes 604A and 604B pulse light capable of penetrating into living tissues including ear lobes and plant leaves. Light emitted from light emitting diodes 604A and 604B causes human skin, blood, and tissues under the skin to fluoresce or re-emit light. Fluorescent light differs from the original light signal by having a longer wavelength and the color of the emitted light depends on the molecules, and bio-materials such as proteins and carbohydrates that are fluorescing. Sweat, for example, flows into holes 614 and black cotton cloth 610 absorbs stray light and sweat. In addition, cotton from black cotton cloth 610 absorbs, spreads, and evaporates moisture to enhance comfort in fastening film sensors to an ear lobe.

Light sensors 606A and 606B detect reflected light at two different wavelengths and are located on the same side as light emitting diodes 604A and 604B, respectively, and are configured to sense sweat from skin by a change in light intensity and noise caused by stray light, motion, and other sources. Thermistor 608 monitors skin temperature. Fluorescing light passes through blood vessels, tissues, and skin to the opposite side of an ear lobe where light sensors 606 are located, wherein light sensors 606 detect transmitted, refracted, and reflected light of predetermined wavelengths. Pulsing light emitting diodes 604A and 604B may be off during detection. Those skilled in the art realize that film fluid monitor 600 can be used to check food, trace chemicals, or contaminants in water.

Figure 24:
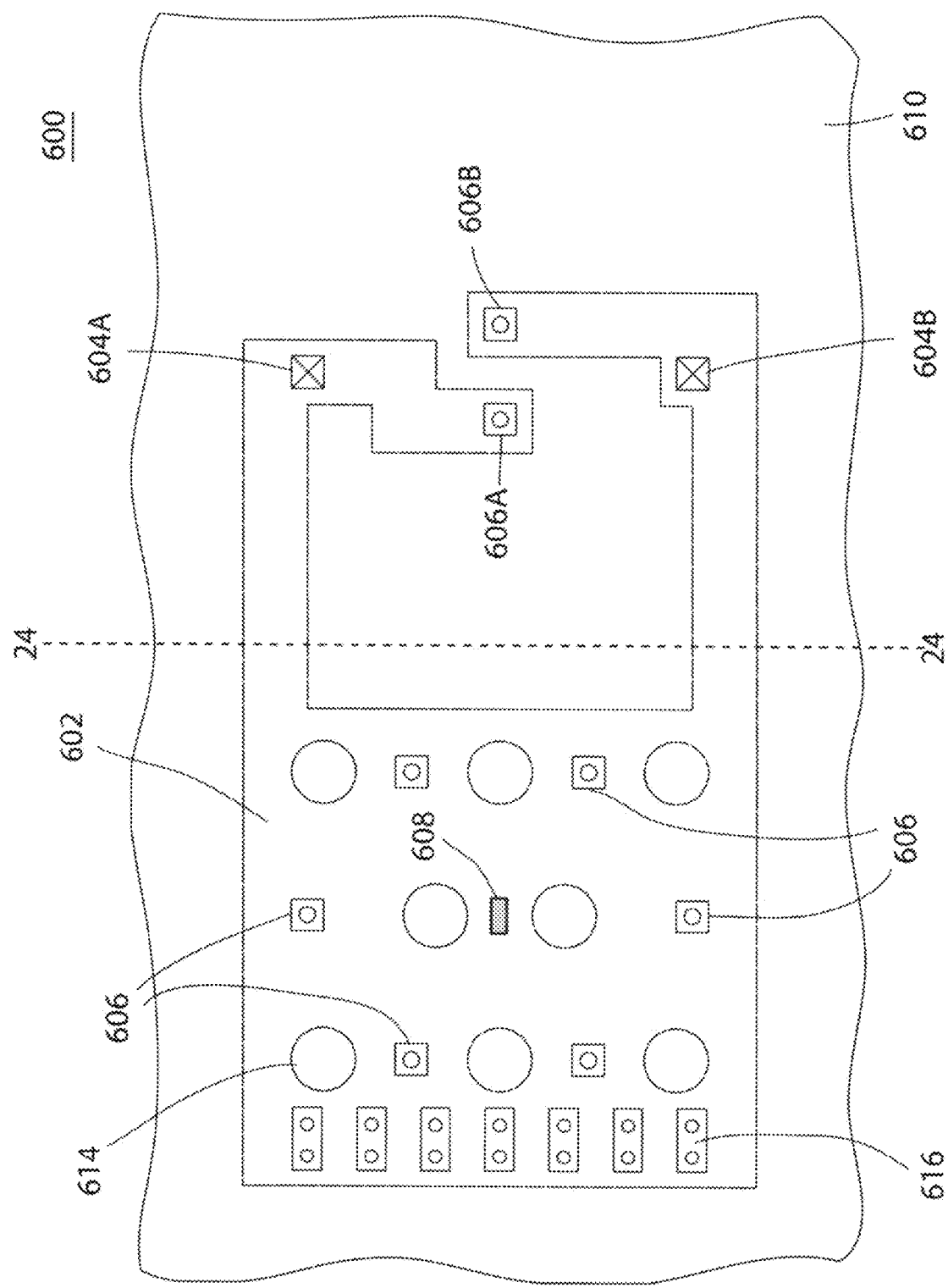
FIG. 24 is a top view of film sensor in accordance with another embodiment of the present invention.
Figure 25:
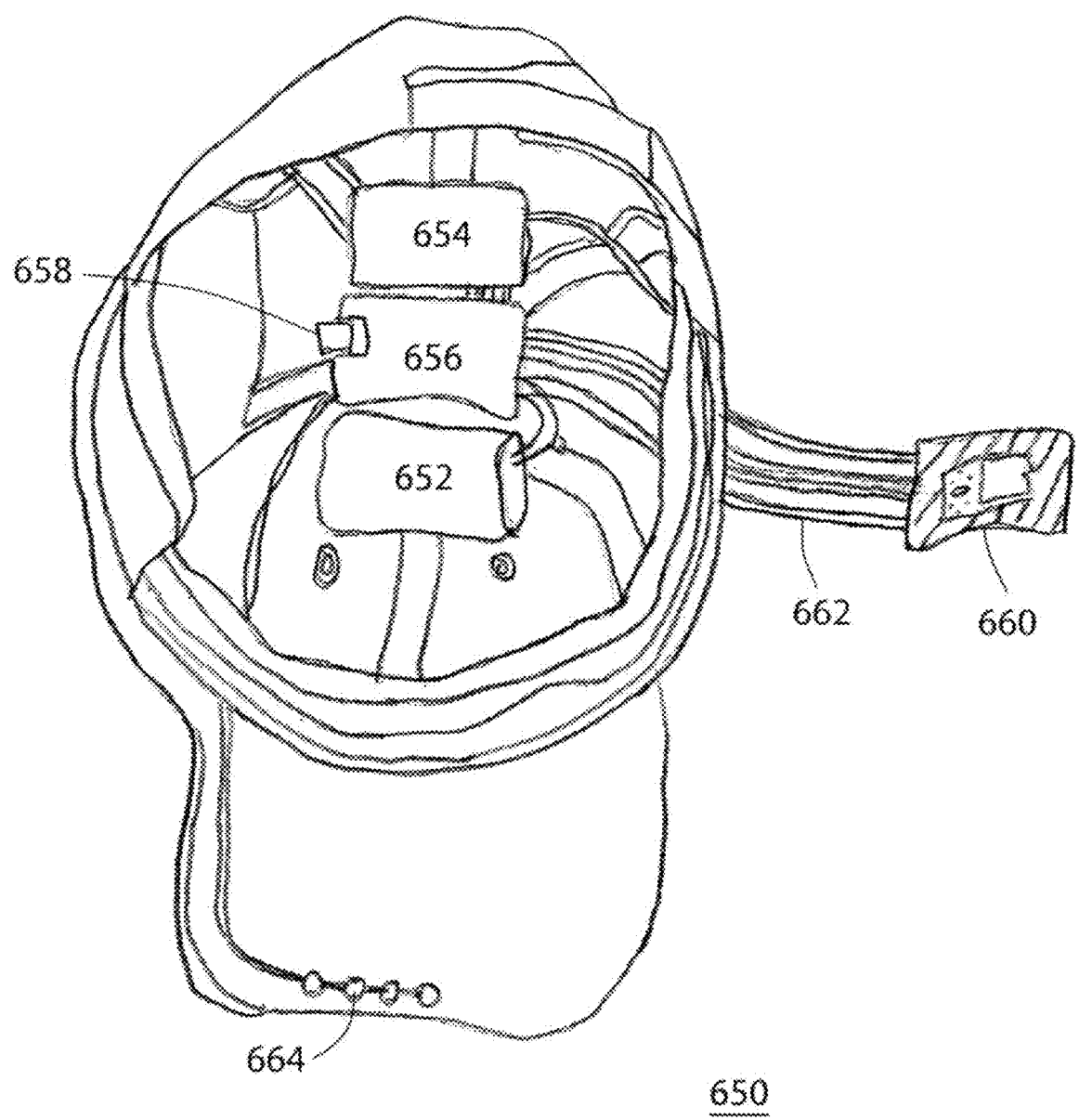
FIG. 25 is a view of a hat having an exposed portion and including a film sensor in accordance with another embodiment of the present invention.

FIG. 25 is a view of a hat 650 on which a battery power supply 652, sensor circuitry 654, which may include light emitting diode pulse circuitry and sensor circuits, a microcontroller 656, a micro-SD card memory 658, and other circuitry such as filters, an analog-to-digital converter, a wireless antenna, and communications circuitry are mounted. A film sensor 660, which may be, for example, film sensor 600 of FIG. 24, is coupled to sensor circuit 654 and microcontroller 656 through wires or interconnects 662.

Alarm devices 664 such as, for example, light emitting diodes or a buzzer, are mounted to hat 650.

Figure 26:
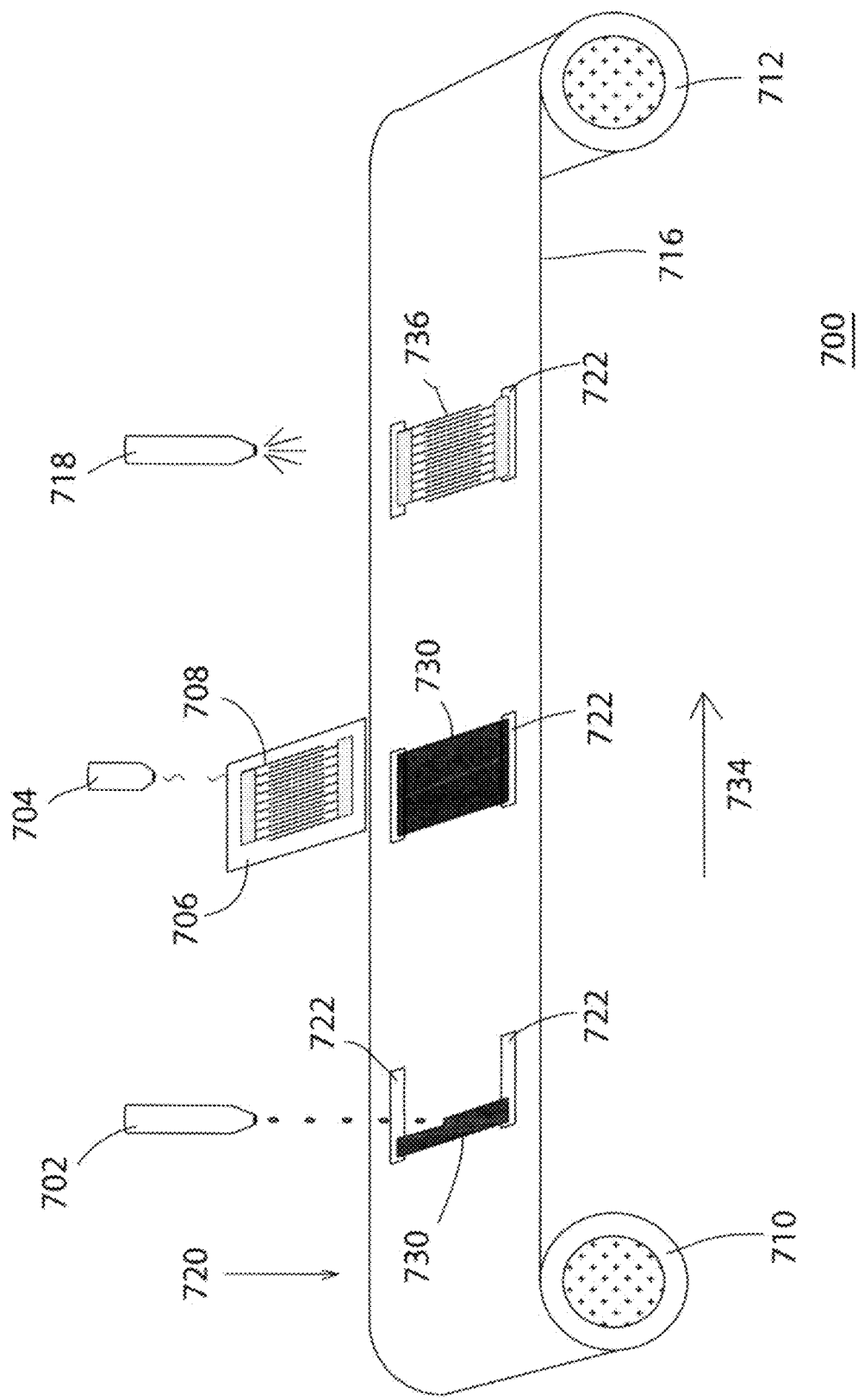
FIG. 26 is a view of a manufacturing flow including a processing system in accordance with another embodiment of the present invention.

FIG. 26 is a view of a manufacturing flow to form electronics in a film in accordance with an embodiment of the present invention. What is shown in FIG. 26 is a processing system 700 that includes an ink jet printer head 702, a scanning light laser 704, a hardmask 706, a chromium metal comb patterning structure 708, and film spools 710 and 712. Film spools 710 and 712 are configured for providing film substrate 716 for processing and then collecting film substrate 716 after processing.

Film electronics 720 including etched copper lines and copper pads 722 are formed on film substrate 716 and film substrate 716 is wound onto film spool 710. Film substrate 716 is placed in processing system 700 for further processing. Processing system 700 selectively prints conductive carbon ink with moving ink printer head 702 to deposit rows of overlapping thin conductive photo-sensitive ink 730 on copper pads 722 and between copper pads 722. Multiple deposition passes are performed adjacent to the edges of copper pads 722 to thicken the ink creating a beveled surface with ink. The ink transitions to become thinner over film substrate 716 between two copper pads 722. A heater hot plate (not shown) is positioned under film substrate 716 to soft bake photo-sensitive ink 730 after conductive carbon ink 730 has been printed. Film substrate 716 travels in the direction indicated by arrow 734.

In a subsequent step, processing system 700 places chrome hardmask 706 in proximity to film substrate 716 and hardmask 706 is aligned to cross fiducial marks (not shown) on film substrate 716. Processing system 700 exposes photo-sensitive ink 730 to ultraviolet light from scanning light laser 704 through chromium metal comb pattern 708 on hard mask 706. Exposure to the intense laser vaporizes carbon and breaks cross-linked macromolecules that bind carbon particles, leaving interdigitated fingers 736 of carbon lines between copper pads 722. Spray head 718 dispenses an adhesive coating such as, for example, silicone over carbon fingers 736 and copper pads 722. A hot plate (not shown) under film 716 cures the adhesive cover.

Film substrate 716 is rolled-up onto spool 712.

Figure 27:
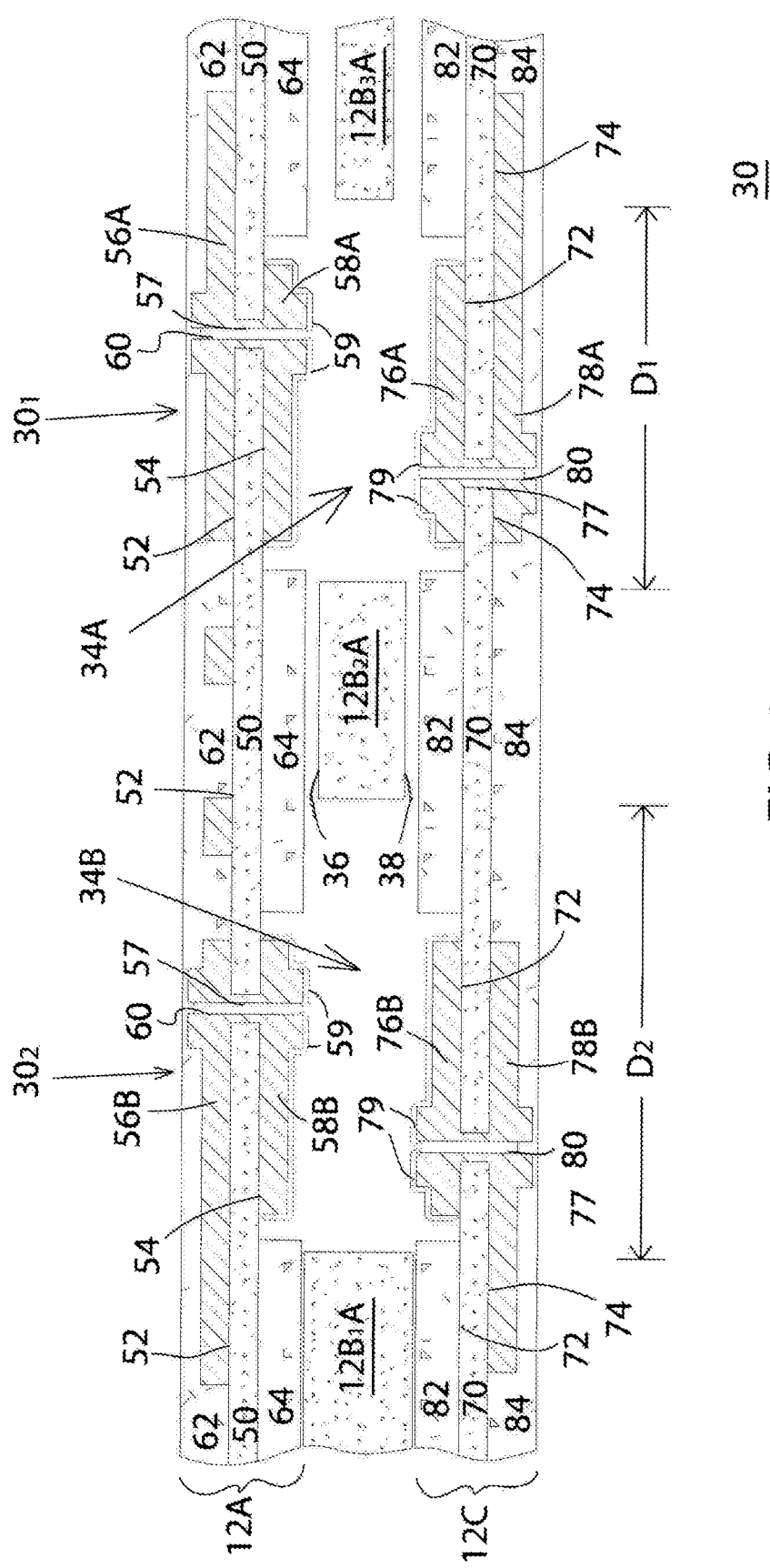
FIG. 27 is a cross-sectional view of a portion of a film sensor array taken along section line 5-5 of FIGS. 2 and 3 in accordance with another embodiment of the present invention.

FIG. 27 is a cross-sectional view of a portion of film sensor array 12-1 taken along section line 5-5 of FIGS. 2 and 3 in accordance with another embodiment of the present invention. The description of FIG. 27 is similar to the description of sensor array 12 of FIG. 5, except that spacer elements $12B_1$, $12B_2$, and $12B_3$ have been replaced by spacer elements $12B_1A$, $12B_2A$, and $12B_3A$, respectively. Spacer element $12B_1A$ has a height that is greater than the height of spacer element $12B_2A$ and spacer element $12B_2A$ has a height that is greater than the height of spacer element $12B_3A$, i.e., the height of spacer $12B_2A$ is less than the height of spacer $12B_1A$ and spacer $12B_3A$ has a height that is less than the height of spacer $12B_2A$. It should be noted that the heights of spacers $12B_1A$, $12B_2A$, and $12B_3A$ can be referred to as the thicknesses of spacers $12B_1A$, $12B_2A$, and $12B_3A$.

By now it should be appreciated that a sensor unit and methods for sensing have been provided. Electronics shrink further after integration of power MOSFETs (Metal Oxide Semiconductor Field Effect Transistors) with conducting lines made from thinner conductor or high temperature superconducting materials such as cuprates, for example, $Bi_2SrCa_2Cu_3O_{10}$ (BSCCO). Those skilled in the art realize there are many materials and many ways to deposit film onto a film substrate besides 3D printing as shown in FIG. 26. Sputtering, pulse laser deposition, electrophoretic deposition, etc. are alternate deposition methods. Another variant in accordance with embodiments of the present invention is that laser source 704 of FIG. 26 may be adapted, configured, and used to anneal the surface film conductors or cuprates to avoid overheating the polyimide substrate 716. Spray coating may represent spray cleaning or spray etching. FIG. 26 represents one of many ways to deposit materials, process as roll-to-roll film, clean, heat, coat, and stabilize the desired characteristics of material for the purpose of mass producing film electronics inexpensively, rapidly, and consistently. A variety of materials such as, but not limited to, nano-rod fluorescence, graphene or graphite, carbon nanotubes, whiskers between biased electrodes, insulating and semiconducting glasses may likewise be selectively and sequentially processed in the roll-to-roll format of FIG. 26. The manufacturing line 700 can be carried out in an air ambient, under vacuum and/or portions of the manufacturing line 700 submerged under fluid.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A sensor structure, comprising:
   a first structure having a first surface and a second surface, wherein a first portion of a first sensing element is formed from a first portion of the first structure;
   a second structure having a first surface and a second surface, wherein the second surface of the first structure is adjacent the first surface of the second structure; and
   a third structure having a first surface and a second surface, wherein a second portion of the first sensing element is formed from a first portion of the second structure, wherein a second portion of the third structure comprises a temperature sensor and a third portion of the third structure comprises a fluid sensor.

2. The sensor structure of claim 1, wherein the first sensing element is a switch.

3. The sensor structure of claim 1, wherein a combination of the first structure, the second structure, and the third structure form a flexible structure.

4. A sensor structure, comprising:
   a first structure having a first surface and a second surface, wherein a first portion of a first sensing element is formed from a first portion of the first structure;
   a second structure having a first surface and a second surface, wherein the second surface of the first structure is adjacent the first surface of the second structure, wherein the second structure comprises a plurality of spacer elements, wherein a first spacer element has a first height and a second spacer element has a second height, the first height less than the second height; and
   a third structure having a first surface and a second surface, wherein a second portion of the first sensing element is formed from a first portion of the second structure.

5. The sensor structure of claim 4, wherein the second structure comprises a plurality of spacer elements, wherein a first spacer element is spaced apart from a second spacer element by a first distance and a third spacer element is spaced apart from second spacer element by a second distance.

6. A sensor structure, comprising:
a first structure having a first surface and a second surface, wherein a first portion of a first sensing element is formed from a first portion of the first structure;
a second structure having a first surface and a second surface, wherein the second surface of the first structure is adjacent the first surface of the second structure, wherein the second structure comprises a plurality of spacer elements, wherein a first spacer element is spaced apart from a second spacer element by a first distance and a third spacer element is spaced apart from second spacer element by a second distance; and
a third structure having a first surface and a second surface, wherein a second portion of the first sensing element is formed from a first portion of the second structure, wherein a first via extends through the first structure and a second via extends through the third structure.

7. A sensor, comprising:
a support structure having a first surface and a second surface;
a film coupled to the first surface of the support structure;
an electronic element coupled to a first portion of the second surface of the support structure;
a first transmission channel coupled to a second portion of the second surface of the support structure;
a second transmission channel coupled to a third portion of the second surface of the support structure; and
a second film coupled to the first transmission channel and to the second transmission channel.

8. The sensor of claim 7, wherein the support structure comprises copper.

9. The sensor of claim 7, wherein the film is coupled to the first surface of the support structure through an adhesive film.

10. The sensor of claim 7, wherein the first transmission channel is an optical fiber.

11. The sensor of claim 10, wherein the second transmission channel is a plastic tube.

12. The sensor of claim 11, wherein the second transmission channel conducts a fluid.

13. The sensor of claim 12, further including a chamber in which the electronic element is positioned.

14. The sensor of claim 13, wherein the optical fiber and the light source are configured to analyze the size and number of blood cells passing by the light source and the optical fiber.

15. The sensor of claim 7, wherein the second transmission channel is a plastic tube.

16. The sensor of claim 7, wherein the sensor is a film sensor.

17. The sensor of claim 7, wherein the electronic element is a light emitting diode.

18. The sensor film of claim 7, wherein the electronic element is a film element.

19. A film sensor, comprising:
a film substrate having a chamber;
a first sensor embedded within the chamber;
integrated electronics embedded in the film substrate;
a second sensor positioned adjacent the chamber;
a plurality of inlet channels coupled to the chamber;
an exhaust port connected to the chamber through an outlet channel; and
a temperature adjustment structure formed in the film substrate.

20. The film sensor of claim 19, wherein the first sensor comprises one of a transducer chip or a sensor material.

21. The film sensor of claim 19, further including trim circuit elements to adjust the integrated electronics embedded in the film substrate.

22. The film sensor of claim 21, wherein the trim circuit elements comprise one or more elements selected from the group of circuit elements comprising an inductor, a capacitor, and a resistor.

23. The film sensor of claim 19, wherein the plurality of inlet channels coupled to the chamber comprise fluid carrying channels.

24. The film sensor of claim 19, further including a first inlet channel of the plurality of inlet channels that is adjacent the integrated electronics embedded in the film substrate.

* * * * *